United States Patent
Eroz et al.

(10) Patent No.: US 7,461,325 B2
(45) Date of Patent: *Dec. 2, 2008

(54) METHOD AND SYSTEM FOR PROVIDING SHORT BLOCK LENGTH LOW DENSITY PARITY CHECK (LDPC) CODES IN SUPPORT OF BROADBAND SATELLITE APPLICATIONS

(75) Inventors: Mustafa Eroz, Germantown, MD (US); Feng-Wen Sun, Germantown, MD (US); Lin-Nan Lee, Potomac, MD (US)

(73) Assignee: The DIRECTV Group, Inc., El Segundo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/805,612

(22) Filed: May 24, 2007

(65) Prior Publication Data

US 2007/0234179 A1    Oct. 4, 2007

(51) Int. Cl.
*H03M 13/00*    (2006.01)
(52) U.S. Cl. .................................... 714/758; 714/801
(58) Field of Classification Search ................ 714/801, 714/804, 758
See application file for complete search history.

(56) References Cited

U.S. PATENT DOCUMENTS

| | | | |
|---|---|---|---|
| 6,633,856 B2 * | 10/2003 | Richardson et al. ........... 706/15 |
| 6,789,227 B2 * | 9/2004 | De Souza et al. ............ 714/804 |
| 6,895,547 B2 * | 5/2005 | Eleftheriou et al. ......... 714/801 |
| 7,000,174 B2 * | 2/2006 | Mantha et al. .............. 714/790 |
| 2002/0051501 A1 * | 5/2002 | Demjanenko et al. ....... 375/298 |

OTHER PUBLICATIONS

Richardson, Thomas J.; Urbanke, Rudiger L.; "Efficient Encoding of Low-Density Parity-Check Codes"; IEEE Transactions on Information Theory; vol. 47, No. 2; Feb. 2001; pp. 638-656.

Richardson, Tom and Urbanke, Rudiger; "The Renaissance of Gallager's Low Density Parity-Check Codes"; IEEE Communications Magazine; IEEE Service Center; Piscataway, New Jersey, US; vol. 41, No. 8; Aug. 2003; pp. 126-131; XP001177711.

Yang, Michael and Ryan, William E.; "Lowering the Error-Rate Floors of Moderate-Length High-Rate Irregular LDPC Codes"; IEEE International Symposium on Information Theory; Yokohama, Japan; Jun. 29, 2003-Jul. 4, 2003; p. 237; XP010657265.

Calzolari, Gian Paolo; "Report on DVB-S2 Channel 1-16 Coding Standardization Effort"; CCSDS Sub-Panel 1B Channel Coding; Spring 2003 Meeting; Matera, Italy; Apr. 7, 2003; pp. 1-11; XP002311762.

(Continued)

*Primary Examiner*—Mujtaba K Chaudry

(57) ABSTRACT

An approach is provided for encoding short frame length Low Density Parity Check (LDPC) codes. An encoder generates a LDPC code having an outer Bose Chaudhuri Hocquenghem (BCH) code. Structure is imposed on the LDPC codes by restricting portion part of the parity check matrix to be lower triangular and/or satisfying other requirements such that the communication between bit nodes and check nodes of the decoder is simplified. Further, a cyclic redundancy check (CRC) encoder is supplied to encode the input signal according to a CRC code. This approach has particular application in digital video broadcast services over satellite.

25 Claims, 6 Drawing Sheets

OTHER PUBLICATIONS

ETSI: "Digital Video Broadcasting (DVB) Second Generation Framing Structure, Channel Coding and Modulation Systems for Broadcasting, Interactive Services, News Gathering and Other Broadband Satellite Applications"; Draft ETSI EN 302 307 V1.1.1; Jun. 2004; pp. 1-74; XP002312174.

Narayanaswami, R.; "Coded Modulation with Low Density Parity Check Codes"; Master Thesis, Texas A&M University; Jun. 2001; p. 1-77; XP002271230.

Jin, Hui et al.; "Irregular Repeat-Accumulate Codes"; 2nd International Symposium on Turbo Codes and Related Topics; Brest, France; pp. 1-4; Sep. 4-7, 2000; XP002325752.

EPO Communication dated Nov. 4, 2005 in European counterpart application No. 04255346.1.

EPO Summons to Attend Oral Proceedings dated Nov. 19, 2007 in European counterpart application No. 04255346.1.

Japanese Notice of Rejection dated Jul. 4, 2006 in Japanese counterpart application No. 2004-258583.

Korean Notice of Rejection dated Apr. 28, 2006 in Korean counterpart application No. 10-2004-70418.

* cited by examiner $$H = \begin{bmatrix} n_1 & n_2 & n_3 & n_4 & n_5 & n_6 & n_7 & n_8 \\ 1 & 0 & 1 & 0 & 1 & 0 & 0 & 1 \\ 0 & 1 & 1 & 0 & 0 & 1 & 1 & 0 \\ 1 & 0 & 0 & 1 & 0 & 1 & 0 & 1 \\ 0 & 1 & 0 & 1 & 1 & 0 & 1 & 0 \end{bmatrix} \begin{matrix} m_1 \\ m_2 \\ m_3 \\ m_4 \end{matrix}$$

$$B = \begin{bmatrix} 1 & & & & & & 0 \\ x & 1 & & & & & \\ x & x & 1 & & & & \\ x & x & x & 1 & & & \\ x & x & x & x & 1 & & \\ x & x & x & x & x & 1 & \\ x & x & x & x & x & x & 1 \end{bmatrix}$$

METHOD AND SYSTEM FOR PROVIDING SHORT BLOCK LENGTH LOW DENSITY PARITY CHECK (LDPC) CODES IN SUPPORT OF BROADBAND SATELLITE APPLICATIONS

RELATED APPLICATIONS

This application is related to, and claims the benefit of the earlier filing date under 35 U.S.C. § 119(e) of, U.S. Provisional Patent Application (Ser. No. 60/500,109) filed Sep. 4, 2003, entitled "Rate ⅗8-PSK and Short Block Length LDPC Codes," U.S. Provisional Patent Application (Ser. No. 60/505,916) filed Sep. 25, 2003, entitled "Short Block Length LDPC Codes" and U.S. Provisional Application Ser. No. 60/518,199 filed Nov. 7, 2003, titled "Rate ⅓, ¼ and ⅖LDPC Code"; the entireties of which are incorporated herein by reference.

FIELD OF THE INVENTION

The present invention relates to communication systems, and more particularly to coded systems.

BACKGROUND OF THE INVENTION

Communication systems employ coding to ensure reliable communication across noisy communication channels. For example, in a wireless (or radio) system, such as a satellite network, noise sources abound, from geographic and environmental factors. These communication channels exhibit a fixed capacity that can be expressed in terms of bits per symbol at certain signal to noise ratio (SNR), defining a theoretical upper limit (known as the Shannon limit). As a result, coding design has aimed to achieve rates approaching this Shannon limit. This objective is particularly germane to bandwidth constrained satellite systems. One such class of codes that approach the Shannon limit is Low Density Parity Check (LDPC) codes.

Traditionally, LDPC codes have not been widely deployed because of a number of drawbacks. One drawback is that the LDPC encoding technique is highly complex. Encoding an LDPC code using its generator matrix would require storing a very large, non-sparse matrix. Additionally, LDPC codes require large blocks to be effective; consequently, even though parity check matrices of LDPC codes are sparse, storing these matrices is problematic.

From an implementation perspective, a number of challenges are confronted. For example, storage is an important reason why LDPC codes have not become widespread in practice. Length LDPC codes, thus, require greater storage space. Also, a key challenge in LDPC code implementation has been how to achieve the connection network between several processing engines (nodes) in the decoder. Further, the computational load in the decoding process, specifically the check node operations, poses a problem.

Therefore, there is a need for an LDPC communication system that employs simple encoding and decoding processes. There is also a need for using LDPC codes efficiently to support high data rates, without introducing greater complexity. There is also a need to improve performance of LDPC encoders and decoders. There is also a need to minimize storage requirements for implementing LDPC coding.

SUMMARY OF THE INVENTION

These and other needs are addressed by the present invention, wherein an approach for encoding short block length Low Density Parity Check (LDPC) codes is provided. An encoder generates a LDPC code having an outer Bose Chaudhuri Hocquenghem (BCH) code according to one of Tables 1-7 for transmission as the LDPC coded signal. Each of the Tables 1-7 specifies the address of parity bit accumulators. Structure is imposed on the LDPC codes by restricting portion part of the parity check matrix to be lower triangular and/or satisfying other requirements such that the communication between bit nodes and check nodes of the decoder is simplified. Further, a cyclic redundancy check (CRC) encoder is supplied to encode the input signal according to a CRC code. The approach advantageously provides expedient encoding as well as decoding of LDPC codes, while minimizing storage and processing resources.

According to another aspect of an embodiment of the present invention, the LDPC codes are represented by signals that are modulated according to a signal constellation that includes one of 8-PSK (Phase Shift Keying), 16-QAM (Quadrature Amplitude Modulation), QPSK (Quadrature Phase Shift Keying), 16-APSK (Amplitude Phase Shift Keying) and 32-APSK.

According to another aspect of an embodiment of the present invention, the modulated LDPC coded signal is transmitted over a satellite link in support of a broadband satellite application.

According to yet another aspect of an embodiment of the present invention, the BCH outer code is based on a generator polynomial of:

$$g(x)=(1+x+x^3+x^5+x^{14})\times(1+x^6+x^8+x^{11}+x^{14})\times(1+x+x^2+x^6+x^9+x^{10}+x^{14})\times(1+x^4+x^7+x^8+x^{10}+x^{12}+x^{14})\times(1+x^2+x^4+x^6+x^8+x^9+x^{11}+x^{13}+x^{14})\times(1+x^3+x^7+x^8+x^9+x^{13}+x^{14})\times(1+x^2+x^5+x^6+x^7+x^{10}+x^{11}+x^{13}+x^{14})\times(1+x^5+x^8+x^9+x^{10}+x^{11}+x^{14})\times(1+x+x^2+x^3+x^9+x^{10}+x^{14})\times(1+x^3+x^6+x^9+x^{11}+x^{12}+x^{14})\times(1+x^4+x^{11}+x^{12}+x^{14})\times(1+x+x^2+x^3+x^5+x^6+x^7+x^8+x^{10}+x^{13}+x^{14}).$$

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which.

DESCRIPTION OF THE PREFERRED EMBODIMENT

A system, method, and software for efficiently encoding short frame length Low Density Parity Check (LDPC) codes are described. In the following description, for the purposes of explanation, numerous specific details are set forth in order to provide a thorough understanding of the present invention. It is apparent, however, to one skilled in the art that the present invention may be practiced without these specific details or with an equivalent arrangement. In other instances, well-known structures and devices are shown in block diagram form in order to avoid unnecessarily obscuring the present invention.

Figure 1:
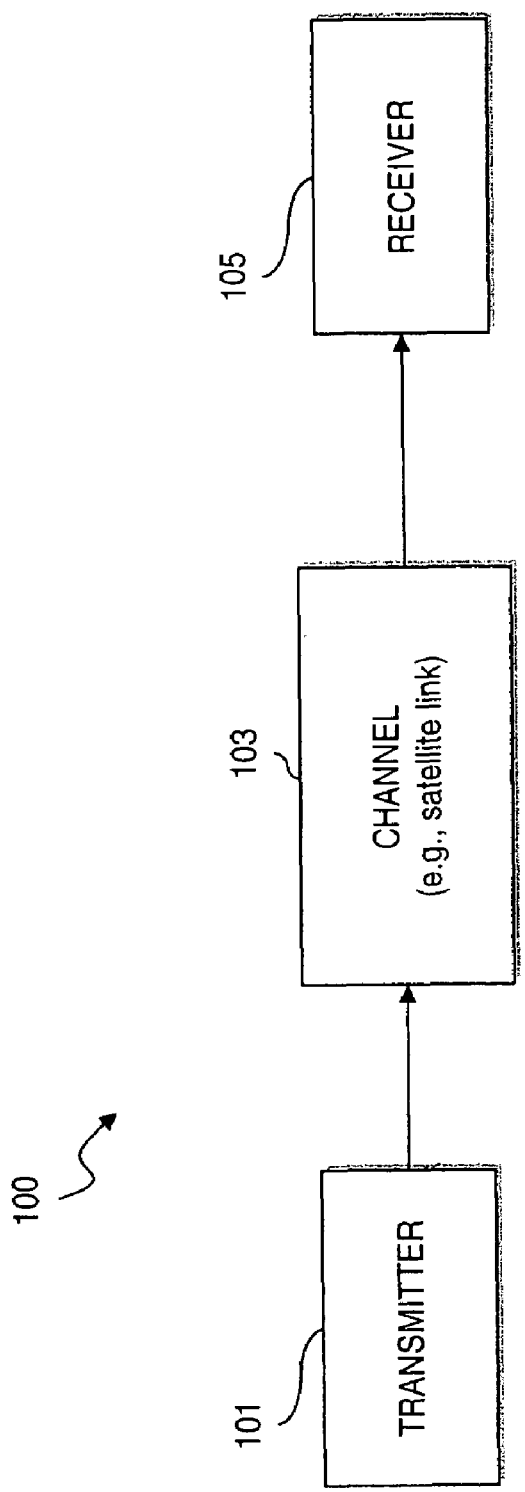
FIG. 1 is a diagram of a communications system configured to utilize Low Density Parity Check (LDPC) codes, according to an embodiment of the present invention.

FIG. 1 is a diagram of a communications system configured to utilize Low Density Parity Check (LDPC) codes, according to an embodiment of the present invention. A digital communications system 100 includes a transmitter 101 that generates signal waveforms across a communication channel 103 to a receiver 105. In this discrete communications system 100, the transmitter 101 has a message source that produces a discrete set of possible messages; each of the possible messages has a corresponding signal waveform. These signal waveforms are attenuated, or otherwise altered, by communications channel 103. To combat the noise channel 103, LDPC codes are utilized.

By way of example, the channel 103 is a satellite link serving satellite terminals (e.g., Very Small Aperture Terminals (VSATs)) in support of broadband satellite applications. Such applications include satellite broadcasting and interactive services (and compliant with the Digital Video Broadcast (DVB)—S 2 standard). The Digital Video Broadcasting via Satellite (DVB-S) standard has been widely adopted worldwide to provide, for instance, digital satellite television programming.

The LDPC codes that are generated by the transmitter 101 enable high speed implementation without incurring any performance loss. These structured LDPC codes output from the transmitter 101 avoid assignment of a small number of check nodes to the bit nodes already vulnerable to channel errors by virtue of the modulation scheme (e.g., 8-PSK).

Such LDPC codes have a parallelizable decoding algorithm (unlike turbo codes), which advantageously involves simple operations such as addition, comparison and table look-up. Moreover, carefully designed LDPC codes do not exhibit any sign of error floor.

According to one embodiment of the present invention, the transmitter 101 generates, using a relatively simple encoding technique, LDPC codes based on parity check matrices (which facilitate efficient memory access during decoding) to communicate with the receiver 105. The transmitter 101 employs LDPC codes that can outperform concatenated turbo+RS (Reed-Solomon) codes, provided the block length is sufficiently large.

Figure 2A:
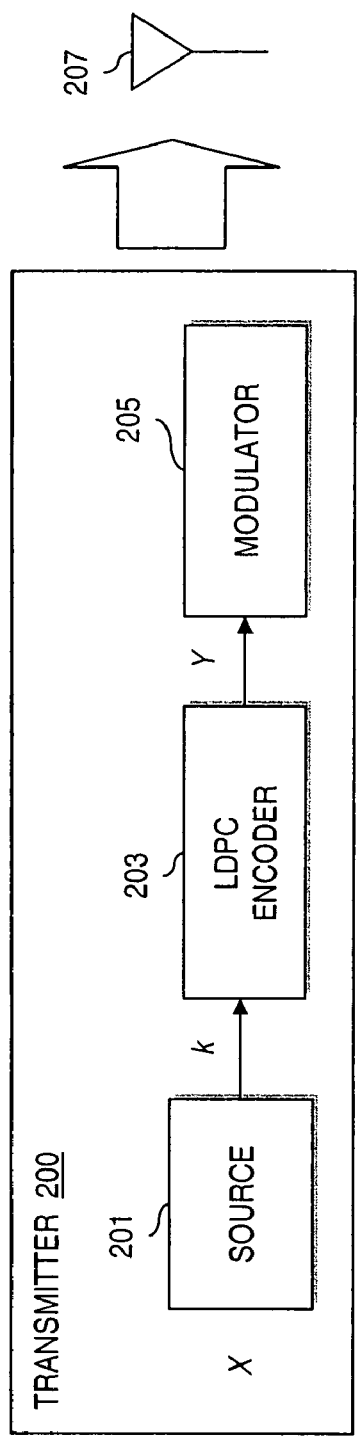
FIGS. 2A and 2B are diagrams of exemplary LDPC encoders deployed in the transmitter of FIG. 1.
Figure 2B:
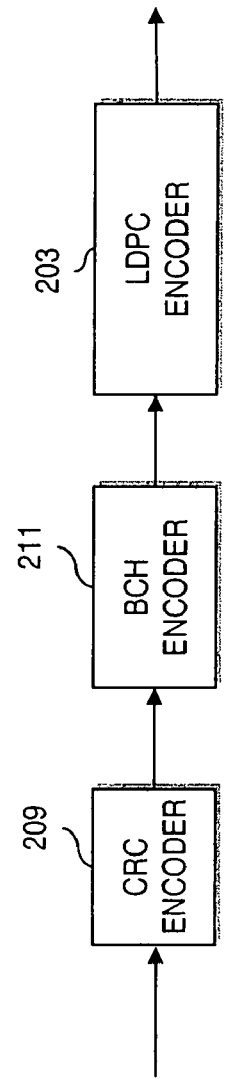

FIGS. 2A and 2B are diagrams of exemplary LDPC encoders deployed in the transmitter of FIG. 1. As seen in FIG. 2A, a transmitter 200 is equipped with an LDPC encoder 203 that accepts input from an information source 201 and outputs coded stream of higher redundancy suitable for error correction processing at the receiver 105. The information source 201 generates k signals from a discrete alphabet, X. LDPC codes are specified with parity check matrices. On the other hand, encoding LDPC codes require, in general, specifying the generator matrices. Even though it is possible to obtain generator matrices from parity check matrices using Gaussian elimination, the resulting matrix is no longer sparse and storing a large generator matrix can be complex.

The encoder 203 generates signals from alphabet Y to a modulator 205 using a simple encoding technique that makes use of only the parity check matrix by imposing structure onto the parity check matrix. Specifically, a restriction is placed on the parity check matrix by constraining certain portion of the matrix to be triangular. The construction of such a parity check matrix is described more fully below in FIG. 6. Such a restriction results in negligible performance loss, and therefore, constitutes an attractive trade-off.

The modulator 205 maps the encoded messages from encoder 203 to signal waveforms that are transmitted to a transmit antenna 207, which emits these waveforms over the communication channel 103. Accordingly, the encoded messages are modulated and distributed to a transmit antenna 207. The transmissions from the transmit antenna 207 propagate to a receiver (shown in FIG. 3), as discussed below.

FIG. 2B shows an LDPC encoder utilized with a Bose Chaudhuri Hocquenghem (BCH) encoder and a cyclic redundancy check (CRC) encoder, according to one embodiment of the present invention. Under this scenario, the codes generated by the LDPC encoder 203, along with the CRC encoder 209 and the BCH encoder 211, have a concatenated outer BCH code and inner low density parity check (LDPC) code. Furthermore, error detection is achieved using cyclic redundancy check (CRC) codes. The CRC encoder 209, in an exemplary embodiment, encodes using an 8-bit CRC code with generator polynomial $(x^5+x^4+x^3+x^2+1)(x^2+x+1)(x+1)$. The CRC code is output to the BCH encoder 211.

Figure 2C:
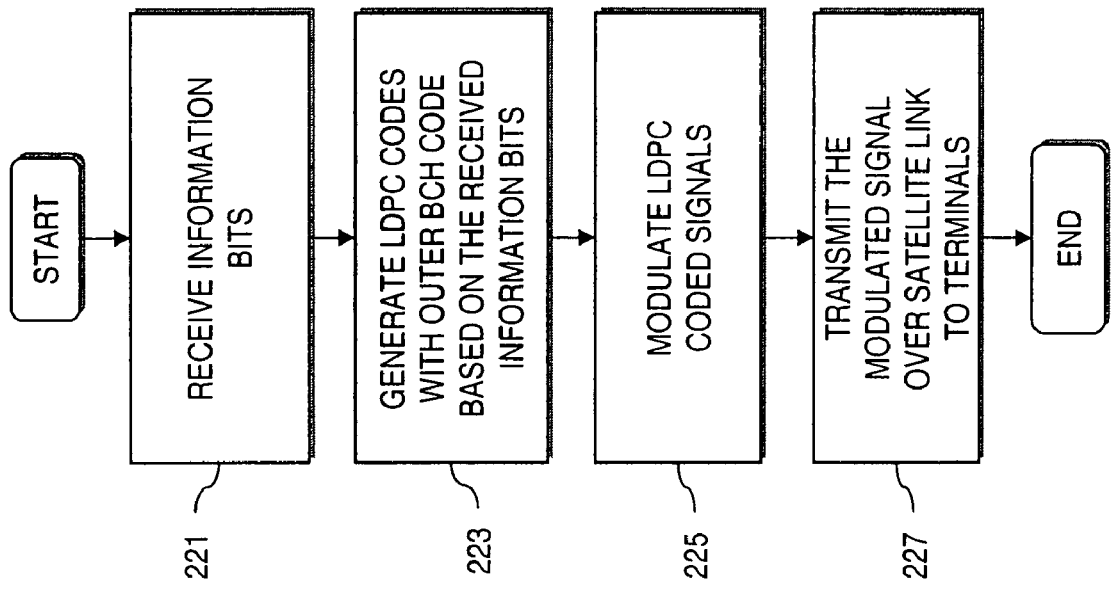
FIG. 2C is a flowchart of the encoding process of the LDPC encoder of FIG. 2B for generating short frame length LDPC codes, according to one embodiment of the present invention.

FIG. 2C provides a flowchart of the encoding process of the LDPC encoder of FIG. 2B for generating short frame length LDPC codes, according to one embodiment of the present invention. In step 211, information bits are received and processed to the chain of encoders 209, 211, and 203. Consequently, the LDPC encoder 203 generates LDPC codes with outer BCH codes based on the received information bits, as in step 223. The codes also contain the CRC code. Next, the LDPC codes are represented by signals that are modulated, per step 225, for transmission over the channel 103, which in an exemplary embodiment, is a satellite link to one or more satellite terminals (step 227).

The LDPC encoder 203 systematically encodes an information block of size $k_{ldpc}$, $i=(i_0,i_1,\ldots,i_{k_{ldpc}-1})$ onto a codeword of size $n_{ldpc}$, $c=(i_0,i_1,\ldots,i_{k_{ldpc}-1},p_0,p_1,\ldots,p_{n_{ldpc}-k_{ldpc}-1})$. The transmission of the codeword starts in the given order from $i_0$ and ends with $p_{n_{ldpc}-k_{ldpc}-1}$. LDPC code parameters $(n_{ldpc}, k_{ldpc})$.

The task of the LDPC encoder 203 is to determine $n_{ldpc}-k_{ldpc}$ parity bits $(p_0,p_1,\ldots,p_{n_{ldpc}-k_{ldpc}-1})$ for every block of $k_{ldpc}$ information bits, $(i_0,i_1,\ldots,i_{k_{ldpc}-1})$. The procedure is as follows. First, the parity bits are initialized;

$p_0=p_1=p_2=\ldots=p_{n_{ldpc}-k_{ldpc}-1}=0$. The first information bit, $i_0$, are accumulated at parity bit addresses specified in the first row of Tables 1-7. By way of example, $k_{ldpc}$ bits are systematically encoded to generate $n_{ldpc}$ bits. According to one embodiment of the present invention, $n_{ldpc}$ is 16200 bits, which is a short block length. Given the relatively short length of such codes, LDPC codes having approximate lengths of 16200 bits or less are deemed "short" block length codes. According to one embodiment of the present invention, the parameters of the short frame length codes are provided in Table 8.

After all of the information bits are exhausted, the final parity bits are obtained as follows. First, the following operations are performed, starting with i=1

$$p_i = p_i \oplus p_{i-1}, i=1,2,\ldots,n_{ldpc}-k_{ldpc}-1.$$

Final content of $p_i$, i=0, 1, ..., $n_{ldpc}-k_{ldpc}-1$ is equal to the parity bit $p_i$.

TABLE 1

Address of Parity Bit Accumulators (Shortened from Rate 1/2)

20 712 2386 6354 4061 1062 5045 5158
21 2543 5748 4822 2348 3089 6328 5876
22 926 5701 269 3693 2438 3190 3507
23 2802 4520 3577 5324 1091 4667 4449
24 5140 2003 1263 4742 6497 1185 6202
0 4046 6934
1 2855 66
2 6694 212
3 3439 1158
4 3850 4422
5 5924 290
6 1467 4049
7 7820 2242
8 4606 3080
9 4633 7877
10 3884 6868
11 8935 4996
12 3028 764
13 5988 1057
14 7411 3450

TABLE 2

Address of Parity Bit Accumulators (Rate 3/5)

2765 5713 6426 3596 1374 4811 2182 544 3394 2840 4310 771
4951 211 2208 723 1246 2928 398 5739 265 5601 5993 2615
210 4730 5777 3096 4282 6238 4939 1119 6463 5298 6320 4016
4167 2063 4757 3157 5664 3956 6045 563 4284 2441 3412 6334
4201 2428 4474 59 1721 736 2997 428 3807 1513 4732 6195
2670 3081 5139 3736 1999 5889 4362 3806 4534 5409 6384 5809
5516 1622 2906 3285 1257 5797 3816 817 875 2311 3543 1205
4244 2184 5415 1705 5642 4886 2333 287 1848 1121 3595 6022
2142 2830 4069 5654 1295 2951 3919 1356 884 1786 396 4738
0 2161 2653
1 1380 1461
2 2502 3707
3 3971 1057
4 5985 6062
5 1733 6028
6 3786 1936
7 4292 956
8 5692 3417
9 266 4878
10 4913 3247
11 4763 3937
12 3590 2903
13 2566 4215
14 5208 4707
15 3940 3388
16 5109 4556
17 4908 4177

TABLE 3

Address of Parity Bit Accumulators (Rate 2/3)

0 2084 1613 1548 1286 1460 3196 4297 2481 3369 3451 4620 2622
1 122 1516 3448 2880 1407 1847 3799 3529 373 971 4358 3108
2 259 3399 929 2650 864 3996 3833 107 5287 164 3125 2350

TABLE 3-continued

Address of Parity Bit Accumulators (Rate 2/3)

3 342 3529
4 4198 2147
5 1880 4836
6 3864 4910
7 243 1542
8 3011 1436
9 2167 2512
10 4606 1003
11 2835 705
12 3426 2365
13 3848 2474
14 1360 1743
0 163 2536
1 2583 1180
2 1542 509
3 4418 1005
4 5212 5117
5 2155 2922
6 347 2696
7 226 4296
8 1560 487
9 3926 1640
10 149 2928
11 2364 563
12 635 688
13 231 1684
14 1129 3894

TABLE 4

Address of Parity Bit Accumulators (Shortened from Rate 3/4)

3 3198 478 4207 1481 1009 2616 1924 3437 554 683 1801
4 2681 2135
5 3107 4027
6 2637 3373
7 3830 3449
8 4129 2060
9 4184 2742
10 3946 1070
11 2239 984
0 1458 3031
1 3003 1328
2 1137 1716
3 132 3725
4 1817 638
5 1774 3447
6 3632 1257
7 542 3694
8 1015 1945
9 1948 412
10 995 2238
11 4141 1907
0 2480 3079
1 3021 1088
2 713 1379
3 997 3903
4 2323 3361
5 1110 986
6 2532 142
7 1690 2405
8 1298 1881
9 615 174
10 1648 3112
11 1415 2808

TABLE 5

Address of Parity Bit Accumulators (Shortened from Rate 4/5)

5 896 1565
6 2493 184
7 212 3210
8 727 1339
9 3428 612
0 2663 1947
1 230 2695
2 2025 2794
3 3039 283
4 862 2889
5 376 2110
6 2034 2286
7 951 2068
8 3108 3542
9 307 1421
0 2272 1197
1 1800 3280
2 331 2308
3 465 2552
4 1038 2479
5 1383 343
6 94 236
7 2619 121
8 1497 2774
9 2116 1855
0 722 1584
1 2767 1881
2 2701 1610
3 3283 1732
4 168 1099
5 3074 243
6 3460 945
7 2049 1746
8 566 1427
9 3545 1168

TABLE 6

Address of Parity Bit Accumulators (Shortened from Rate 5/6)

3 2409 499 1481 908 559 716 1270 333 2508 2264 1702 2805
4 2447 1926
5 414 1224
6 2114 842
7 212 573
0 2383 2112
1 2286 2348
2 545 819
3 1264 143
4 1701 2258
5 964 166
6 114 2413
7 2243 81
0 1245 1581
1 775 169
2 1696 1104
3 1914 2831
4 532 1450
5 91 974
6 497 2228
7 2326 1579
0 2482 256
1 1117 1261
2 1257 1658
3 1478 1225
4 2511 980
5 2320 2675
6 435 1278
7 228 503
0 1885 2369
1 57 483
2 838 1050
3 1231 1990
4 1738 68

TABLE 6-continued

Address of Parity Bit Accumulators (Shortened from Rate 5/6)

5 2392 951
6 163 645
7 2644 1704

TABLE 7

Address of Parity Bit Accumulators (Rate 8/9)

0 1558 712 805
1 1450 873 1337
2 1741 1129 1184
3 294 806 1566
4 482 605 923
0 926 1578
1 777 1374
2 608 151
3 1195 210
4 1484 692
0 427 488
1 828 1124
2 874 1366
3 1500 835
4 1496 502
0 1006 1701
1 1155 97
2 657 1403
3 1453 624
4 429 1495
0 809 385
1 367 151
2 1323 202
3 960 318
4 1451 1039
0 1098 1722
1 1015 1428
2 1261 1564
3 544 1190
4 1472 1246
0 508 630
1 421 1704
2 284 898
3 392 577
4 1155 556
0 631 1000
1 732 1368
2 1328 329
3 1515 506
4 1104 1172

Tables 8-10 provide other exemplary code rates, ⅓, ⅕ and ⅖ for $n_{ldpc}$ of 16200 bits:

TABLE 8

Address of Parity Bit Accumulators (Rate 1/3)

416 8909 4156 3216 3112 2560 2912 6405 8593 4969 6723 6912
8978 3011 4339 9312 6396 2957 7288 5485 6031 10218 2226 3575
3383 10059 1114 10008 10147 9384 4290 434 5139 3536 1965 2291
2797 3693 7615 7077 743 1941 8716 6215 3840 5140 4582 5420
6110 8551 1515 7404 4879 4946 5383 1831 3441 9569 10472 4306
1505 5682 7778
7172 6830 6623
7281 3941 3505
10270 8669 914
3622 7563 9388
9930 5058 4554
4844 9609 2707
6883 3237 1714
4768 3878 10017
10127 3334 8267

TABLE 9

Address of Parity Bit Accumulators (Shortened from Rate 1/5)

6295 9626 304 7695 4839 4936 1660 144 11203 5567 6347 12557
10691 4988 3859 3734 3071 3494 7687 10313 5964 8069 8296 11090
10774 3613 5208 11177 7676 3549 8746 6583 7239 12265 2674 4292
11869 3708 5981 8718 4908 10650 6805 3334 2627 10461 9285 11120
7844 3079 10773
3385 10854 5747
1360 12010 12202
6189 4241 2343
9840 12726 4977

TABLE 10

Address of Parity Bit Accumulators (Rate 2/5)

5650 4143 8750 583 6720 8071 635 1767 1344 6922 738 6658
5696 1685 3207 415 7019 5023 5608 2605 857 6915 1770 8016
3992 771 2190 7258 8970 7792 1802 1866 6137 8841 886 1931
4108 3781 7577 6810 9322 8226 5396 5867 4428 8827 7766 2254
4247 888 4367 8821 9660 324 5864 4774 227 7889 6405 8963
9693 500 2520 2227 1811 9330 1928 5140 4030 4824 806 3134
1652 8171 1435
3366 6543 3745
9286 8509 4645
7397 5790 8972
6597 4422 1799
9276 4041 3847
8683 7378 4946
5348 1993 9186
6724 9015 5646
4502 4439 8474
5107 7342 9442
1387 8910 2660

After all of the information bits are exhausted, the final parity bits are obtained as follows. First, the following operations are performed, starting with i=1

$$p_i = p_i \oplus p_{i-1}, i=1,2,\ldots,n_{ldpc}-k_{ldpc}-1.$$

Final content of $p_i$, $i=0,1,\ldots,n_{ldpc}-k_{ldpc}-1$ is equal to the parity bit $p_i$.

As regards the BCH encoder 211, the BCH code parameters are enumerated in Table 11, with $n_{ldpc}$ equal to 16200.

TABLE 11

| $k_{ldpc}$ | $k_{bch}$ | BCH Correction (bits) | Effective LDPC Rate $k_{ldpc}/n_{ldpc}$ |
|---|---|---|---|
| 7200 | 7032 | 12 | 0.444 |
| 9720 | 9552 | 12 | 3/5 |
| 10800 | 10632 | 12 | 2/3 |
| 11880 | 11712 | 12 | 0.733 |
| 12600 | 12432 | 12 | 0.777 |
| 13320 | 13152 | 12 | 0.822 |
| 14400 | 14232 | 12 | 8/9 |

The generator polynomial of the BCH code utilized by the BCH encoder 211 is as follows:

$$g(x)=(1+x+x^3+x^5+x^{14})\times(1+x^6+x^8+x^{11}+x^{14})\times(1+x+x^2+x^6+x^9+x^{10}+x^{14})\times(1+x^4+x^7+x^8+x^{10}+x^{12}+x^{14})\times(1+x^2+x^4+x^6+x^8+x^9+x^{11}+x^{13}+x^{14})\times(1+x^3+x^7+x^8+x^9+x^{13}+x^{14})\times(1+x^2+x^5+x^6+x^7+x^{10}+x^{11}+x^{13}+x^{14})\times(1+x^5+x^8+x^9+x^{10}+x^{11}+x^{14})\times(1+x+x^2+x^3+x^9+x^{10}+x^{14})\times(1+x^3+x^6+x^9+x^{11}+x^{12}+x^{14})\times(1+x^4+x^{11}+x^{12}+x^{14})\times(1+x+x^2+x^3+x^5+x^6+x^7+x^8+x^{10}+x^{13}+x^{14}).$$

BCH encoding information bits $m=(m_{k_{bch}-1},m_{k_{bch}-2},\ldots,m_1,m_0)$ onto a codeword $c=(m_{k_{bch}-1},m_{k_{bch}-2},\ldots,m_1,m_0,d_{n_{bch}-k_{bch}-1},d_{n_{bch}-k_{bch}-2},\ldots,d_1,d_0)$ is achieved as follows. The message polynomial $m(x)=m_{k_{bch}-1}x^{k_{bch}-1}+m_{k_{bch}-2}x^{k_{bch}-2}+\ldots+m_1x+m_0$ is multiplied by $x^{n_{bch}-k_{bch}}$. Next $x^{n_{bch}-k_{bch}}m(x)$ divided by $g(x)$. With $d(x)=d_{n_{bch}-k_{bch}-1}x^{n_{bch}-k_{bch}-1}+\ldots+d_1x+d_0$ as the remainder, the codeword polynomial is set as follows: $c(x)=x^{n_{bch}-k_{bch}}m(x)+d(x)$.

As mentioned, the above LDPC codes, in an exemplary embodiment, can be used to variety of digital video applications, such as MPEG (Motion Pictures Expert Group) packet transmission.

Figure 3:
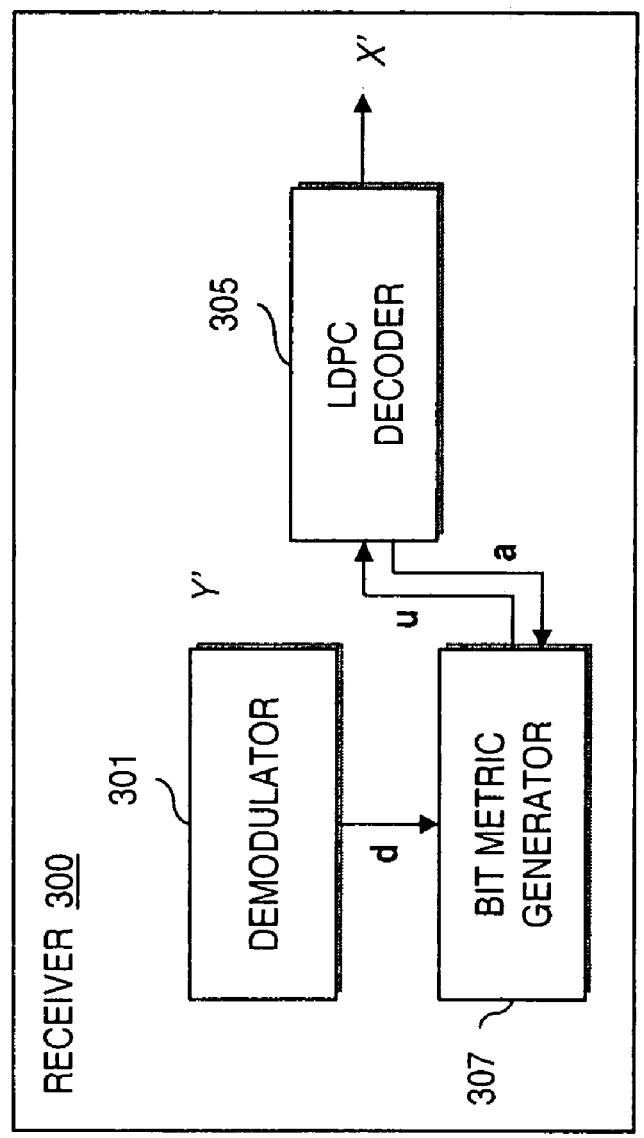
FIG. 3 is a diagram of an exemplary receiver in the system of FIG. 1.

FIG. 3 is a diagram of an exemplary receiver in the system of FIG. 1. At the receiving side, a receiver 300 includes a demodulator 301 that performs demodulation of received signals from transmitter 200. These signals are received at a receive antenna 303 for demodulation. After demodulation, the received signals are forwarded to a decoder 305, which attempts to reconstruct the original source messages by generating messages, X', in conjunction with a bit metric generator 307. The bit metric generator 307 may exchange information with the decoder 305 back and forth (iteratively) during the decoding process. These decoding approaches are more fully described in co-pending application, entitled "Method and System for Routing in Low Density Parity Check (LDPC) Decoders," filed Jul. 3, 2003 (Ser. No. 10/613,824), which is incorporated herein in its entirety. To appreciate the advantages offered by the present invention, it is instructive to examine how LDPC codes are generated, as discussed in FIG. 4.

Figures 4, 5, 6:
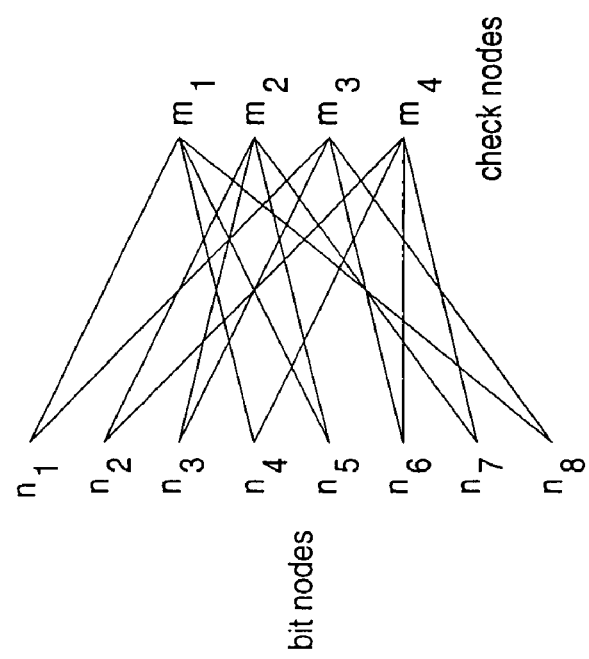
FIG. 4 is a diagram of a sparse parity check matrix, in accordance with an embodiment of the present invention.
FIG. 5 is a diagram of a bipartite graph of an LDPC code of the matrix of FIG. 4.
FIG. 6 is a diagram of a sub-matrix of a sparse parity check matrix, wherein the sub-matrix contains parity check values restricted to the lower triangular region, according to an embodiment of the present invention.

FIG. 4 is a diagram of a sparse parity check matrix, in accordance with an embodiment of the present invention. LDPC codes are long, linear block codes with sparse parity check matrix $H_{(n-k)\times n}$. Typically the block length, n, ranges from thousands to tens of thousands of bits. For example, a parity check matrix for an LDPC code of length n=8 and rate ½ is shown in FIG. 4. The same code can be equivalently represented by the bipartite graph, per FIG. 5.

FIG. 5 is a diagram of a bipartite graph of an LDPC code of the matrix of FIG. 4. Parity check equations imply that for each check node, the sum (over GF (Galois Field)(2)) of all adjacent bit nodes is equal to zero. As seen in the figure, bit nodes occupy the left side of the graph and are associated with one or more check nodes, according to a predetermined relationship. For example, corresponding to check node $m_1$, the following expression exists $n_1+n_4+n_5+n_8=0$ with respect to the bit nodes.

Returning the receiver 303, the LDPC decoder 305 is considered a message passing decoder, whereby the decoder 305 aims to find the values of bit nodes. To accomplish this task, bit nodes and check nodes iteratively communicate with each other. The nature of this communication is described below.

From check nodes to bit nodes, each check node provides to an adjacent bit node an estimate ("opinion") regarding the value of that bit node based on the information coming from other adjacent bit nodes. For instance, in the above example if the sum of $n_4$, $n_5$ and $n_8$ "looks like" 0 to $m_1$, then $m_1$ would indicate to $n_1$ that the value of $n_1$ is believed to be 0 (since $n_1+n_4+n_5+n_8=0$); otherwise $m_1$ indicate to $n_1$ that the value of $n_1$ is believed to be 1. Additionally, for soft decision decoding, a reliability measure is added.

From bit nodes to check nodes, each bit node relays to an adjacent check node an estimate about its own value based on the feedback coming from its other adjacent check nodes. In the above example $n_1$ has only two adjacent check nodes $m_1$ and $m_3$. If the feedback coming from $m_3$ to $n_1$ indicates that the value of $n_1$ is probably 0, then $n_1$ would notify $m_1$ that an estimate of $n_1$'s own value is 0. For the case in which the bit node has more than two adjacent check nodes, the bit node performs a majority vote (soft decision) on the feedback coming from its other adjacent check nodes before reporting that decision to the check node it communicates. The above process is repeated until all bit nodes are considered to be correct (i.e., all parity check equations are satisfied) or until a predetermined maximum number of iterations is reached, whereby a decoding failure is declared.

FIG. 6 is a diagram of a sub-matrix of a sparse parity check matrix, wherein the sub-matrix contains parity check values restricted to the lower triangular region, according to an embodiment of the present invention. As described previously, the encoder 203 (of FIGS. 2A and 2B) can employ a simple encoding technique by restricting the values of the lower triangular area of the parity check matrix. According to an embodiment of the present invention, the restriction imposed on the parity check matrix is of the form:

$$H_{(n-k) \times n} = [A_{(n-k) \times k} B_{(n-k) \times (n-k)}],$$

where B is lower triangular.

Any information block $i=(i_0, i_1, \ldots, i_{k-1})$ is encoded to a codeword $c=(i_0, i_1, \ldots, i_{k-1}, p_0, p_1, \ldots, p_{n-k-1})$ using $HC^T=0$, and recursively solving for parity bits; for example, $$a_{00}i_0 + a_{01}i_1 + \ldots + a_{0,k-1}i_{k-1} + p_0 = 0 \Rightarrow \text{Solve } p_0$$

$$a_{10}i_0 + a_{11}i_1 + \ldots + a_{1,k-1}i_{k-1} + b_{10}p_0 + p_1 = 0 \Rightarrow \text{Solve } p_1$$

and similarly for $p_2, p_3, \ldots, p_{n-k-1}$.

Figure 7:
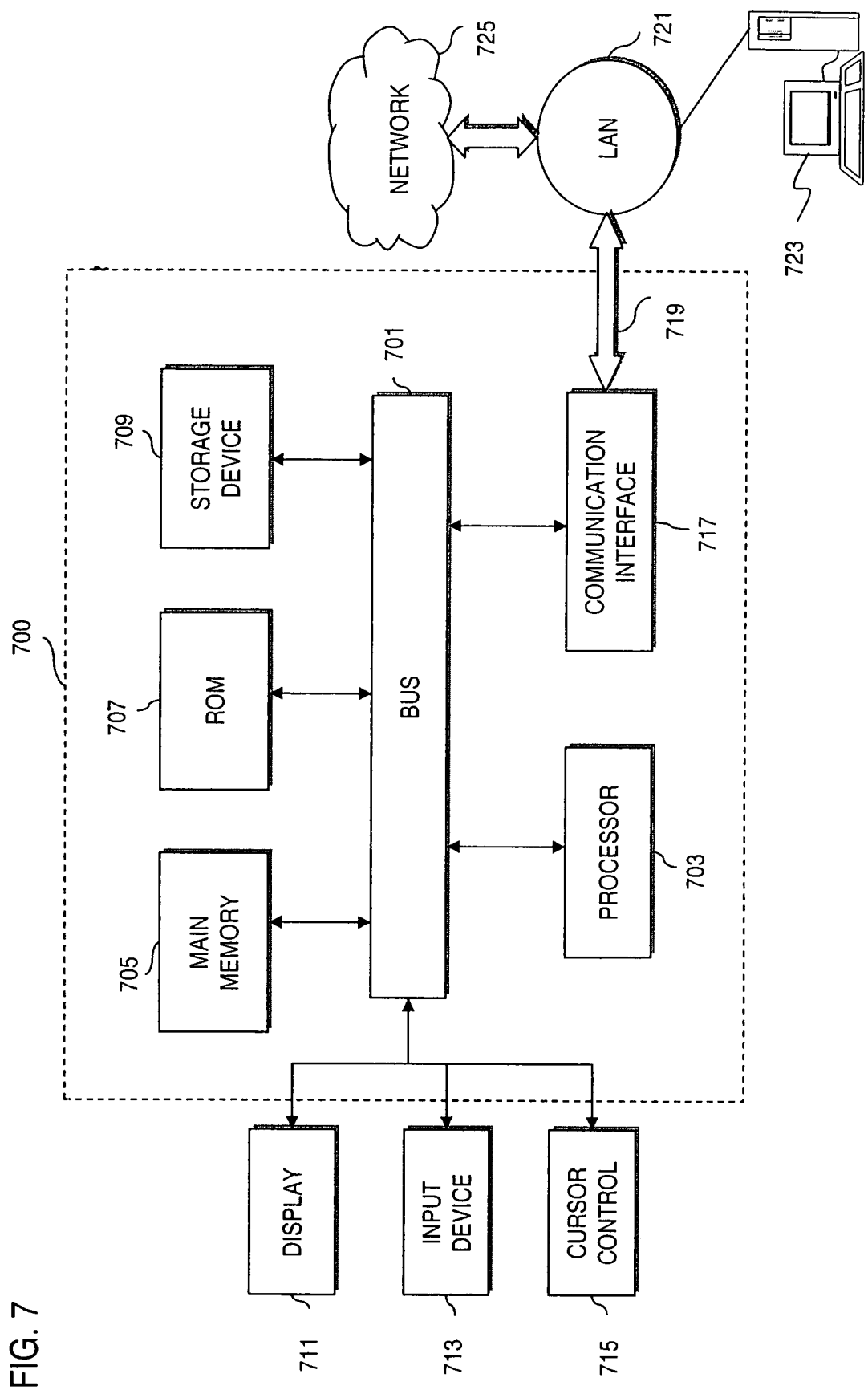
FIG. 7 is a diagram of a computer system that can perform the LDPC encoding process, in accordance with embodiments of the present invention.

FIG. 7 illustrates a computer system upon which an embodiment according to the present invention can be implemented. The computer system 700 includes a bus 701 or other communication mechanism for communicating information, and a processor 703 coupled to the bus 701 for processing information. The computer system 700 also includes main memory 705, such as a random access memory (RAM) or other dynamic storage device, coupled to the bus 701 for storing information and instructions to be executed by the processor 703. Main memory 705 can also be used for storing temporary variables or other intermediate information during execution of instructions to be executed by the processor 703. The computer system 700 further includes a read only memory (ROM) 707 or other static storage device coupled to the bus 701 for storing static information and instructions for the processor 703. A storage device 709, such as a magnetic disk or optical disk, is additionally coupled to the bus 701 for storing information and instructions.

The computer system 700 may be coupled via the bus 701 to a display 711, such as a cathode ray tube (CRT), liquid crystal display, active matrix display, or plasma display, for displaying information to a computer user. An input device 713, such as a keyboard including alphanumeric and other keys, is coupled to the bus 701 for communicating information and command selections to the processor 703. Another type of user input device is cursor control 715, such as a mouse, a trackball, or cursor direction keys for communicating direction information and command selections to the processor 703 and for controlling cursor movement on the display 711.

According to one embodiment of the invention, generation of LDPC codes is provided by the computer system 700 in response to the processor 703 executing an arrangement of instructions contained in main memory 705. Such instructions can be read into main memory 705 from another computer-readable medium, such as the storage device 709. Execution of the arrangement of instructions contained in main memory 705 causes the processor 703 to perform the process steps described herein. One or more processors in a multi-processing arrangement may also be employed to execute the instructions contained in main memory 705. In alternative embodiments, hard-wired circuitry may be used in place of or in combination with software instructions to implement the embodiment of the present invention. Thus, embodiments of the present invention are not limited to any specific combination of hardware circuitry and software.

The computer system 700 also includes a communication interface 717 coupled to bus 701. The communication interface 717 provides a two-way data communication coupling to a network link 719 connected to a local network 721. For example, the communication interface 717 may be a digital subscriber line (DSL) card or modem, an integrated services digital network (ISDN) card, a cable modem, or a telephone modem to provide a data communication connection to a corresponding type of telephone line. As another example, communication interface 717 may be a local area network (LAN) card (e.g. for Ethernet™ or an Asynchronous Transfer Model (ATM) network) to provide a data communication connection to a compatible LAN. Wireless links can also be implemented. In any such implementation, communication interface 717 sends and receives electrical, electromagnetic, or optical signals that carry digital data streams representing various types of information. Further, the communication interface 717 can include peripheral interface devices, such as a Universal Serial Bus (USB) interface, a PCMCIA (Personal Computer Memory Card International Association) interface, etc.

The network link 719 typically provides data communication through one or more networks to other data devices. For example, the network link 719 may provide a connection through local network 721 to a host computer 723, which has connectivity to a network 725 (e.g. a wide area network (WAN) or the global packet data communication network now commonly referred to as the "Internet") or to data equipment operated by service provider. The local network 721 and network 725 both use electrical, electromagnetic, or optical signals to convey information and instructions. The signals through the various networks and the signals on network link 719 and through communication interface 717, which communicate digital data with computer system 700, are exemplary forms of carrier waves bearing the information and instructions.

The computer system 700 can send messages and receive data, including program code, through the network(s), network link 719, and communication interface 717. In the Internet example, a server (not shown) might transmit requested code belonging to an application program for implementing an embodiment of the present invention through the network 725, local network 721 and communication interface 717. The processor 703 may execute the transmitted code while being received and/or store the code in storage device 79, or other non-volatile storage for later execution. In this manner, computer system 700 may obtain application code in the form of a carrier wave.

The term "computer-readable medium" as used herein refers to any medium that participates in providing instructions to the processor 703 for execution. Such a medium may take many forms, including but not limited to non-volatile media, volatile media, and transmission media. Non-volatile media include, for example, optical or magnetic disks, such as storage device 709. Volatile media include dynamic memory, such as main memory 705. Transmission media include coaxial cables, copper wire and fiber optics, including the wires that comprise bus 701. Transmission media can also take the form of acoustic, optical, or electromagnetic waves, such as those generated during radio frequency (RF) and infrared (IR) data communications. Common forms of computer-readable media include, for example, a floppy disk, a flexible disk, hard disk, magnetic tape, any other magnetic medium, a CD-ROM, CDRW, DVD, any other optical medium, punch cards, paper tape, optical mark sheets, any other physical medium with patterns of holes or other optically recognizable indicia, a RAM, a PROM, and EPROM, a FLASH-EPROM, any other memory chip or cartridge, a carrier wave, or any other medium from which a computer can read.

Various forms of computer-readable media may be involved in providing instructions to a processor for execution. For example, the instructions for carrying out at least part of the present invention may initially be borne on a magnetic disk of a remote computer. In such a scenario, the remote computer loads the instructions into main memory and sends the instructions over a telephone line using a modem. A modem of a local computer system receives the data on the telephone line and uses an infrared transmitter to convert the data to an infrared signal and transmit the infrared signal to a portable computing device, such as a personal digital assistance (PDA) and a laptop. An infrared detector on the portable computing device receives the information and instructions borne by the infrared signal and places the data on a bus. The bus conveys the data to main memory, from which a processor retrieves and executes the instructions. The instructions received by main memory may optionally be stored on storage device either before or after execution by processor.

Accordingly, the various embodiments of the present invention provide an approach for encoding short block length Low Density Parity Check (LDPC) codes. An encoder generates a LDPC code having an outer Bose Chaudhuri Hocquenghem (BCH) code according to one of Tables 1-10 for transmission as the LDPC coded signal. Each of the Tables 1-10 specifies the address of parity bit accumulators. Structure is imposed on the LDPC codes by restricting portion part of the parity check matrix to be lower triangular and/or satisfying other requirements such that the communication between bit nodes and check nodes of the decoder is simplified. Further, a cyclic redundancy check (CRC) encoder is supplied to encode the input signal according to a CRC code. The above approach advantageously yields reduced complexity without sacrificing performance.

While the present invention has been described in connection with a number of embodiments and implementations, the present invention is not so limited but covers various obvious modifications and equivalent arrangements, which fall within the purview of the appended claims.

What is claimed is:

1. A method for encoding data comprising:
generating, based on information bits, a Low Density Parity Check (LDPC) code by accumulating bits at parity bit addresses as specified by any one of Tables 1-10 for transmission as an LDPC coded signal, wherein parity bits, $p_i$, are determined according to $p_i = p_i \oplus p_{i-1}$, $i=1,2,\ldots,n_{ldpc}-k_{ldpc}-1$, $k_{ldpc}$ being information block size and $n_{ldpc}$ being codeword size:

TABLE 1

Address of Parity Bit Accumulators (Shortened from Rate 1/2)

20 712 2386 6354 4061 1062 5045 5158
21 2543 5748 4822 2348 3089 6328 5876
22 926 5701 269 3693 2438 3190 3507
23 2802 4520 3577 5324 1091 4667 4449
24 5140 2003 1263 4742 6497 1185 6202
0 4046 6934
1 2855 66

TABLE 1-continued

Address of Parity Bit Accumulators (Shortened from Rate 1/2)

2 6694 212
3 3439 1158
4 3850 4422
5 5924 290
6 1467 4049
7 7820 2242
8 4606 3080
9 4633 7877
10 3884 6868
11 8935 4996
12 3028 764
13 5988 1057
14 7411 3450

TABLE 2

Address of Parity Bit Accumulators (Rate 3/5)

2765 5713 6426 3596 1374 4811 2182 544 3394 2840 4310 771
4951 211 2208 723 1246 2928 398 5739 265 5601 5993 2615
210 4730 5777 3096 4282 6238 4939 1119 6463 5298 6320 4016
4167 2063 4757 3157 5664 3956 6045 563 4284 2441 3412 6334
4201 2428 4474 59 1721 736 2997 428 3807 1513 4732 6195
2670 3081 5139 3736 1999 5889 4362 3806 4534 5409 6384 5809
5516 1622 2906 3285 1257 5797 3816 817 875 2311 3543 1205
4244 2184 5415 1705 5642 4886 2333 287 1848 1121 3595 6022
2142 2830 4069 5654 1295 2951 3919 1356 884 1786 396 4738
0 2161 2653
1 1380 1461
2 2502 3707
3 3971 1057
4 5985 6062
5 1733 6028
6 3786 1936
7 4292 956
8 5692 3417
9 266 4878
10 4913 3247
11 4763 3937
12 3590 2903
13 2566 4215
14 5208 4707
15 3940 3388
16 5109 4556
17 4908 4177

TABLE 3

Address of Parity Bit Accumulators (Rate 2/3)

0 2084 1613 1548 1286 1460 3196 4297 2481 3369 3451 4620 2622
1 122 1516 3448 2880 1407 1847 3799 3529 373 971 4358 3108
2 259 3399 929 2650 864 3996 3833 107 5287 164 3125 2350
3 342 3529
4 4198 2147
5 1880 4836
6 3864 4910
7 243 1542
8 3011 1436
9 2167 2512
10 4606 1003
11 2835 705
12 3426 2365
13 3848 2474
14 1360 1743
0 163 2536
1 2583 1180
2 1542 509
3 4418 1005
4 5212 5117
5 2155 2922
6 347 2696

TABLE 3-continued

Address of Parity Bit Accumulators (Rate 2/3)

7 226 4296
8 1560 487
9 3926 1640
10 149 2928
11 2364 563
12 635 688
13 231 1684
14 1129 3894

TABLE 4

Address of Parity Bit Accumulators (Shortened from Rate 3/4)

3 3198 478 4207 1481 1009 2616 1924 3437 554 683 1801
4 2681 2135
5 3107 4027
6 2637 3373
7 3830 3449
8 4129 2060
9 4184 2742
10 3946 1070
11 2239 984
0 1458 3031
1 3003 1328
2 1137 1716
3 132 3725
4 1817 638
5 1774 3447
6 3632 1257
7 542 3694
8 1015 1945
9 1948 412
10 995 2238
11 4141 1907
0 2480 3079
1 3021 1088
2 713 1379
3 997 3903
4 2323 3361
5 1110 986
6 2532 142
7 1690 2405
8 1298 1881
9 615 174
10 1648 3112
11 1415 2808

TABLE 5

Address of Parity Bit Accumulators (Shortened from Rate 4/5)

5 896 1565
6 2493 184
7 212 3210
8 727 1339
9 3428 612
0 2663 1947
1 230 2695
2 2025 2794
3 3039 283
4 862 2889
5 376 2110
6 2034 2286
7 951 2068
8 3108 3542
9 307 1421
0 2272 1197
1 1800 3280
2 331 2308
3 465 2552
4 1038 2479
5 1383 343

TABLE 5-continued

Address of Parity Bit Accumulators (Shortened from Rate 4/5)

6 94 236
7 2619 121
8 1497 2774
9 2116 1855
0 722 1584
1 2767 1881
2 2701 1610
3 3283 1732
4 168 1099
5 3074 243
6 3460 945
7 2049 1746
8 566 1427
9 3545 1168

TABLE 6

Address of Parity Bit Accumulators (Shortened from Rate 5/6)

3 2409 499 1481 908 559 716 1270 333 2508 2264 1702 2805
4 2447 1926
5 414 1224
6 2114 842
7 212 573
0 2383 2112
1 2286 2348
2 545 819
3 1264 143
4 1701 2258
5 964 166
6 114 2413
7 2243 81
0 1245 1581
1 775 169
2 1696 1104
3 1914 2831
4 532 1450
5 91 974
6 497 2228
7 2326 1579
0 2482 256
1 1117 1261
2 1257 1658
3 1478 1225
4 2511 980
5 2320 2675
6 435 1278
7 228 503
0 1885 2369
1 57 483
2 838 1050
3 1231 1990
4 1738 68
5 2392 951
6 163 645
7 2644 1704

TABLE 7

Address of Parity Bit Accumulators (Rate 8/9)

0 1558 712 805
1 1450 873 1337
2 1741 1129 1184
3 294 806 1566
4 482 605 923
0 926 1578
1 777 1374
2 608 151
3 1195 210
4 1484 692
0 427 488

TABLE 7-continued

Address of Parity Bit Accumulators (Rate 8/9)

1 828 1124
2 874 1366
3 1500 835
4 1496 502
0 1006 1701
1 1155 97
2 657 1403
3 1453 624
4 429 1495
0 809 385
1 367 151
2 1323 202
3 960 318
4 1451 1039
0 1098 1722
1 1015 1428
2 1261 1564
3 544 1190
4 1472 1246
0 508 630
1 421 1704
2 284 898
3 392 577
4 1155 556
0 631 1000
1 732 1368
2 1328 329
3 1515 506
4 1104 1172

TABLE 8

Address of Parity Bit Accumulators (Rate 1/3)

416 8909 4156 3216 3112 2560 2912 6405 8593 4969 6723 6912
8978 3011 4339 9312 6396 2957 7288 5485 6031 10218 2226 3575
3383 10059 1114 10008 10147 9384 4290 434 5139 3536 1965 2291
2797 3693 7615 7077 743 1941 8716 6215 3840 5140 4582 5420
6110 8551 1515 7404 4879 4946 5383 1831 3441 9569 10472 4306
1505 5682 7778
7172 6830 6623
7281 3941 3505
10270 8669 914
3622 7563 9388
9930 5058 4554
4844 9609 2707
6883 3237 1714
4768 3878 10017
10127 3334 8267

TABLE 9

Address of Parity Bit Accumulators (Shortened from Rate 1/5)

6295 9626 304 7695 4839 4936 1660 144 11203 5567 6347 12557
10691 4988 3859 3734 3071 3494 7687 10313 5964 8069 8296 11090
10774 3613 5208 11177 7676 3549 8746 6583 7239 12265 2674 4292
11869 3708 5981 8718 4908 10650 6805 3334 2627 10461 9285 11120
7844 3079 10773
3385 10854 5747
1360 12010 12202
6189 4241 2343
9840 12726 4977

TABLE 10

Address of Parity Bit Accumulators (Rate 2/5)

5650 4143 8750 583 6720 8071 635 1767 1344 6922 738 6658
5696 1685 3207 415 7019 5023 5608 2605 857 6915 1770 8016

TABLE 10-continued

Address of Parity Bit Accumulators (Rate 2/5)

3992 771 2190 7258 8970 7792 1802 1866 6137 8841 886 1931
4108 3781 7577 6810 9322 8226 5396 5867 4428 8827 7766 2254
4247 888 4367 8821 9660 324 5864 4774 227 7889 6405 8963
9693 500 2520 2227 1811 9330 1928 5140 4030 4824 806 3134
1652 8171 1435
3366 6543 3745
9286 8509 4645
7397 5790 8972
6597 4422 1799
9276 4041 3847
8683 7378 4946
5348 1993 9186
6724 9015 5646
4502 4439 8474
5107 7342 9442
1387 8910 2660.

2. A method according to claim 1, wherein a Bose Chaudhuri Hocquenghem (BCH) outer code is used based on a generator polynomial of:

$$g(x)=(1+x+x^3+x^5+x^{14})\times(1+x^6+x^8+x^{11}+x^{14})\times(1+x+x^2+x^6+x^9+x^{10}+x^{14})\times(1+x^4+x^7+x^8+x^{10}+x^{12}+x^{14})\times(1+x^2+x^4+x^6+x^8+x^9+x^{11}+x^{13}+x^{14})\times(1+x^3+x^7+x^8+x^9+x^{13}+x^{14})\times(1+x^2+x^5+x^6+x^7+x^{10}+x^{11}+x^{13}+x^{14})\times(1+x^5+x^8+x^9+x^{10}+x^{11}+x^{14})\times(1+x+x^2+x^3+x^9+x^{10}+x^{14})\times(1+x^3+x^6+x^9+x^{11}+x^{12}+x^{14})\times(1+x^4+x^{11}+x^{12}+x^{14})\times(1+x+x^2+x^3+x^5+x^6+x^7+x^8+x^{10}+x^{13}+x^{14}).$$

3. A method according to claim 1, wherein $n_{ldpc}$ equals to 16200, and a Bose Chaudhuri Hocquenghem (BCH) outer code is applied to the LDPC code according to Table 11 to output a coded signal:

TABLE 11

| $k_{ldpc}$ | $k_{bch}$ | BCH Correction (bits) | Effective LDPC Rate $k_{ldpc}/n_{ldpc}$ |
|---|---|---|---|
| 7200 | 7032 | 12 | 0.444 |
| 9720 | 9552 | 12 | 3/5 |
| 10800 | 10632 | 12 | 2/3 |
| 11880 | 11712 | 12 | 0.733 |
| 12600 | 12432 | 12 | 0.777 |
| 13320 | 13152 | 12 | 0.822 |
| 14400 | 14232 | 12 | 8/9. |

4. A method according to claim 3, wherein the coded signal is utilized in a digital video application.

5. A method according to claim 4, wherein the video application conforms with MPEG (Motion Pictures Expert Group) packet transmission.

6. A method according to claim 1, further comprising;
encoding the information bits using cyclic redundancy check (CRC) coding having a Generator polynomial of $(x^5+x^4+x^3+x^2+1)(x^2+x+1)(x+1)$.

7. A computer-readable storage medium bearing instructions for supporting transmission of a Low Density Parity Check (LDPC) coded signal, wherein said instructions are arranged, upon execution, to cause one or more processors to perform the method of claim 1.

8. A receiver configured to receive a signal encoded in accordance with claim 1.

9. An apparatus for encoding data, comprising:
logic configured to generate, based on information bits, an Low Density Parity Check (LDPC) code by accumulating bits at parity bit addresses as specified by any one of Tables 1-10 for transmission as the LDPC coded signal, wherein parity bits, $p_i$, are determined according to $p_i = p_i \oplus p_{i-1}$, $i=1,2,\ldots,n_{ldpc}-k_{ldpc}-1$, $k_{ldpc}$ being information block size and $n_{ldpc}$ being codeword size:

TABLE 1

Address of Parity Bit Accumulators (Shortened from Rate 1/2)

20 712 2386 6354 4061 1062 5045 5158
21 2543 5748 4822 2348 3089 6328 5876
22 926 5701 269 3693 2438 3190 3507
23 2802 4520 3577 5324 1091 4667 4449
24 5140 2003 1263 4742 6497 1185 6202
0 4046 6934
1 2855 66
2 6694 212
3 3439 1158
4 3850 4422
5 5924 290
6 1467 4049
7 7820 2242
8 4606 3080
9 4633 7877
10 3884 6868
11 8935 4996
12 3028 764
13 5988 1057
14 7411 3450

TABLE 2

Address of Parity Bit Accumulators (Rate 3/5)

2765 5713 6426 3596 1374 4811 2182 544 3394 2840 4310 771
4951 211 2208 723 1246 2928 398 5739 265 5601 5993 2615
210 4730 5777 3096 4282 6238 4939 1119 6463 5298 6320 4016
4167 2063 4757 3157 5664 3956 6045 563 4284 2441 3412 6334
4201 2428 4474 59 1721 736 2997 428 3807 1513 4732 6195
2670 3081 5139 3736 1999 5889 4362 3806 4534 5409 6384 5809
5516 1622 2906 3285 1257 5797 3816 817 875 2311 3543 1205
4244 2184 5415 1705 5642 4886 2333 287 1848 1121 3595 6022
2142 2830 4069 5654 1295 2951 3919 1356 884 1786 396 4738
0 2161 2653
1 1380 1461
2 2502 3707
3 3971 1057
4 5985 6062
5 1733 6028
6 3786 1936
7 4292 956
8 5692 3417
9 266 4878
10 4913 3247
11 4763 3937
12 3590 2903
13 2566 4215
14 5208 4707
15 3940 3388
16 5109 4556
17 4908 4177

TABLE 3

Address of Parity Bit Accumulators (Rate 2/3)

0 2084 1613 1548 1286 1460 3196 4297 2481 3369 3451 4620 2622
1 122 1516 3448 2880 1407 1847 3799 3529 373 971 4358 3108
2 259 3399 929 2650 864 3996 3833 107 5287 164 3125 2350
3 342 3529
4 4198 2147
5 1880 4836
6 3864 4910
7 243 1542
8 3011 1436
9 2167 2512
10 4606 1003
11 2835 705
12 3426 2365

TABLE 3-continued

Address of Parity Bit Accumulators (Rate 2/3)

13 3848 2474
14 1360 1743
0 163 2536
1 2583 1180
2 1542 509
3 4418 1005
4 5212 5117
5 2155 2922
6 347 2696
7 226 4296
8 1560 487
9 3926 1640
10 149 2928
11 2364 563
12 635 688
13 231 1684
14 1129 3894

TABLE 4

Address of Parity Bit Accumulators (Shortened from Rate 3/4)

3 3198 478 4207 1481 1009 2616 1924 3437 554 683 1801
4 2681 2135
5 3107 4027
6 2637 3373
7 3830 3449
8 4129 2060
9 4184 2742
10 3946 1070
11 2239 984
0 1458 3031
1 3003 1328
2 1137 1716
3 132 3725
4 1817 638
5 1774 3447
6 3632 1257
7 542 3694
8 1015 1945
9 1948 412
10 995 2238
11 4141 1907
0 2480 3079
1 3021 1088
2 713 1379
3 997 3903
4 2323 3361
5 1110 986
6 2532 142
7 1690 2405
8 1298 1881
9 615 174
10 1648 3112
11 1415 2808

TABLE 5

Address of Parity Bit Accumulators (Shortened from Rate 4/5)

5 896 1565
6 2493 184
7 212 3210
8 727 1339
9 3428 612
0 2663 1947
1 230 2695
2 2025 2794
3 3039 283
4 862 2889
5 376 2110
6 2034 2286

TABLE 5-continued

Address of Parity Bit Accumulators (Shortened from Rate 4/5)

7 951 2068
8 3108 3542
9 307 1421
0 2272 1197
1 1800 3280
2 331 2308
3 465 2552
4 1038 2479
5 1383 343
6 94 236
7 2619 121
8 1497 2774
9 2116 1855
0 722 1584
1 2767 1881
2 2701 1610
3 3283 1732
4 168 1099
5 3074 243
6 3460 945
7 2049 1746
8 566 1427
9 3545 1168

TABLE 6

Address of Parity Bit Accumulators (Shortened from Rate 5/6)

3 2409 499 1481 908 559 716 1270 333 2508 2264 1702 2805
4 2447 1926
5 414 1224
6 2114 842
7 212 573
0 2383 2112
1 2286 2348
2 545 819
3 1264 143
4 1701 2258
5 964 166
6 114 2413
7 2243 81
0 1245 1581
1 775 169
2 1696 1104
3 1914 2831
4 532 1450
5 91 974
6 497 2228
7 2326 1579
0 2482 256
1 1117 1261
2 1257 1658
3 1478 1225
4 2511 980
5 2320 2675
6 435 1278
7 228 503
0 1885 2369
1 57 483
2 838 1050
3 1231 1990
4 1738 68
5 2392 951
6 163 645
7 2644 1704

TABLE 7

Address of Parity Bit Accumulators (Rate 8/9)

0 1558 712 805
1 1450 873 1337
2 1741 1129 1184

TABLE 7-continued

Address of Parity Bit Accumulators (Rate 8/9)

3 294 806 1566
4 482 605 923
0 926 1578
1 777 1374
2 608 151
3 1195 210
4 1484 692
0 427 488
1 828 1124
2 874 1366
3 1500 835
4 1496 502
0 1006 1701
1 1155 97
2 657 1403
3 1453 624
4 429 1495
0 809 385
1 367 151
2 1323 202
3 960 318
4 1451 1039
0 1098 1722
1 1015 1428
2 1261 1564
3 544 1190
4 1472 1246
0 508 630
1 421 1704
2 284 898
3 392 577
4 1155 556
0 631 1000
1 732 1368
2 1328 329
3 1515 506
4 1104 1172

TABLE 8

Address of Parity Bit Accumulators (Rate 1/3)

416 8909 4156 3216 3112 2560 2912 6405 8593 4969 6723 6912
8978 3011 4339 9312 6396 2957 7288 5485 6031 10218 2226 3575
3383 10059 1114 10008 10147 9384 4290 434 5139 3536 1965 2291
2797 3693 7615 7077 743 1941 8716 6215 3840 5140 4582 5420
6110 8551 1515 7404 4879 4946 5383 1831 3441 9569 10472 4306
1505 5682 7778
7172 6830 6623
7281 3941 3505
10270 8669 914
3622 7563 9388
9930 5058 4554
4844 9609 2707
6883 3237 1714
4768 3878 10017
10127 3334 8267

TABLE 9

Address of Parity Bit Accumulators (Shortened from Rate 1/5)

6295 9626 304 7695 4839 4936 1660 144 11203 5567 6347 12557
10691 4988 3859 3734 3071 3494 7687 10313 5964 8069 8296 11090
10774 3613 5208 11177 7676 3549 8746 6583 7239 12265 2674 4292
11869 3708 5981 8718 4908 10650 6805 3334 2627 10461 9285 11120
7844 3079 10773
3385 10854 5747
1360 12010 12202
6189 4241 2343
9840 12726 4977

TABLE 10

Address of Parity Bit Accumulators (Rate 2/5)

5650 4143 8750 583 6720 8071 635 1767 1344 6922 738 6658
5696 1685 3207 415 7019 5023 5608 2605 857 6915 1770 8016
3992 771 2190 7258 8970 7792 1802 1866 6137 8841 886 1931
4108 3781 7577 6810 9322 8226 5396 5867 4428 8827 7766 2254
4247 888 4367 8821 9660 324 5864 4774 227 7889 6405 8963
9693 500 2520 2227 1811 9330 1928 5140 4030 4824 806 3134
1652 8171 1435
3366 6543 3745
9286 8509 4645
7397 5790 8972
6597 4422 1799
9276 4041 3847
8683 7378 4946
5348 1993 9186
6724 9015 5646
4502 4439 8474
5107 7342 9442
1387 8910 2660.

10. An apparatus according to claim 9, wherein a Bose Chaudhuri Hocquenghem (BCH) outer code is applied to the LDPC code based on a generator polynomial of:

$g(x)=(1+x+x^3+x^5+x^{14})\times(1+x^6+x^8+x^{11}+x^{14})\times(1+x+x^2+x^6+x^9+x^{10}+x^{14})\times(1+x^4+x^7+x^8+x^{10}+x^{12}+x^{14})\times(1+x^2+x^4+x^6+x^8+x^9+x^{11}+x^{13}+x^{14})\times(1+x^3+x^7+x^8+x^9+x^{13}+x^{14})\times(1+x^2+x^5+x^6+x^7+x^{10}+x^{11}+x^{13}+x^{14})\times(1+x^5+x^8+x^9+x^{10}+x^{11}+x^{14})\times(1+x+x^2+x^3+x^9+x^{10}+x^{14})\times(1+x^3+x^6+x^9+x^{11}+x^{12}+x^{14})\times(1+x^4+x^{11}+x^{12}+x^{14})\times(1+x+x^2+x^3+x^5+x^6+x^7+x^8+x^{10}+x^{13}+x^{14})$.

11. An apparatus according to claim 9, wherein $n_{ldpc}$ equals to 16200, the apparatus further comprising:
logic configured to apply a Bose Chaudhuri Hocquenghem (BCH) outer code to the LDPC code according to Table 11 to output a coded signal:

TABLE 11

| $k_{ldpc}$ | $k_{bch}$ | BCH Correction (bits) | Effective LDPC Rate $k_{ldpc}/n_{ldpc}$ |
|---|---|---|---|
| 7200 | 7032 | 12 | 0.444 |
| 9720 | 9552 | 12 | 3/5 |
| 10800 | 10632 | 12 | 2/3 |
| 11880 | 11712 | 12 | 0.733 |
| 12600 | 12432 | 12 | 0.777 |
| 13320 | 13152 | 12 | 0.822 |
| 14400 | 14232 | 12 | 8/9. |

12. An apparatus according to claim 11, wherein the coded signal is utilized in a digital video application.

13. An apparatus according to claim 11, wherein the digital video application conforms with MPEG (Motion Pictures Expert Group) packet transmission.

14. A An apparatus according to claim 11, wherein the logic is further configured to encode the information bits using cyclic redundancy check (CRC) coding having a generator polynomial of $(x^5+x^4+x^3+x^2+1)(x^2+x+1)(x+1)$.

15. A transmitter system for encoding data, comprising:
a cyclic redundancy check (CRC) encoder configured to encode information bits;
a Bose Chaudhuri Hocquenghem (BCH) encoder configured to receive the CRC encoded bits; and
a Low Density Parity Check (LDPC) encoder coupled to the BCH encoder for outputting, based on the information bits, an LDPC code having an outer BCH code by accumulating bits at parity bit addresses as specified by any one of Tables 1-10 for transmission as the LDPC coded signal, wherein parity bits, $p_i$, are determined according to $p_i=p_i\oplus p_{i-1}$, $i=1,2,\ldots,n_{ldpc}-k_{ldpc}-1$, $k_{ldpc}$ being information block size and $n_{ldpc}$ being codeword size:

TABLE 1

Address of Parity Bit Accumulators (Shortened from Rate 1/2)

20 712 2386 6354 4061 1062 5045 5158
21 2543 5748 4822 2348 3089 6328 5876
22 926 5701 269 3693 2438 3190 3507
23 2802 4520 3577 5324 1091 4667 4449
24 5140 2003 1263 4742 6497 1185 6202
0 4046 6934
1 2855 66
2 6694 212
3 3439 1158
4 3850 4422
5 5924 290
6 1467 4049
7 7820 2242
8 4606 3080
9 4633 7877
10 3884 6868
11 8935 4996
12 3028 764
13 5988 1057
14 7411 3450

TABLE 2

Address of Parity Bit Accumulators (Rate 3/5)

2765 5713 6426 3596 1374 4811 2182 544 3394 2840 4310 771
4951 211 2208 723 1246 2928 398 5739 265 5601 5993 2615
210 4730 5777 3096 4282 6238 4939 1119 6463 5298 6320 4016
4167 2063 4757 3157 5664 3956 6045 563 4284 2441 3412 6334
4201 2428 4474 59 1721 736 2997 428 3807 1513 4732 6195
2670 3081 5139 3736 1999 5889 4362 3806 4534 5409 6384 5809
5516 1622 2906 3285 1257 5797 3816 817 875 2311 3543 1205
4244 2184 5415 1705 5642 4886 2333 287 1848 1121 3595 6022
2142 2830 4069 5654 1295 2951 3919 1356 884 1786 396 4738
0 2161 2653
1 1380 1461
2 2502 3707
3 3971 1057
4 5985 6062
5 1733 6028
6 3786 1936
7 4292 956
8 5692 3417
9 266 4878
10 4913 3247
11 4763 3937
12 3590 2903
13 2566 4215
14 5208 4707
15 3940 3388
16 5109 4556
17 4908 4177

TABLE 3

Address of Parity Bit Accumulators (Rate 2/3)

0 2084 1613 1548 1286 1460 3196 4297 2481 3369 3451 4620 2622
1 122 1516 3448 2880 1407 1847 3799 3529 373 971 4358 3108
2 259 3399 929 2650 864 3996 3833 107 5287 164 3125 2350
3 342 3529
4 4198 2147
5 1880 4836
6 3864 4910
7 243 1542
8 3011 1436
9 2167 2512
10 4606 1003

TABLE 3-continued

Address of Parity Bit Accumulators (Rate 2/3)

11 2835 705
12 3426 2365
13 3848 2474
14 1360 1743
0 163 2536
1 2583 1180
2 1542 509
3 4418 1005
4 5212 5117
5 2155 2922
6 347 2696
7 226 4296
8 1560 487
9 3926 1640
10 149 2928
11 2364 563
12 635 688
13 231 1684
14 1129 3894

TABLE 4

Address of Parity Bit Accumulators (Shortened from Rate 3/4)

3 3198 478 4207 1481 1009 2616 1924 3437 554 683 1801
4 2681 2135
5 3107 4027
6 2637 3373
7 3830 3449
8 4129 2060
9 4184 2742
10 3946 1070
11 2239 984
0 1458 3031
1 3003 1328
2 1137 1716
3 132 3725
4 1817 638
5 1774 3447
6 3632 1257
7 542 3694
8 1015 1945
9 1948 412
10 995 2238
11 4141 1907
0 2480 3079
1 3021 1088
2 713 1379
3 997 3903
4 2323 3361
5 1110 986
6 2532 142
7 1690 2405
8 1298 1881
9 615 174
10 1648 3112
11 1415 2808

TABLE 5

Address of Parity Bit Accumulators (Shortened from Rate 4/5)

5 896 1565
6 2493 184
7 212 3210
8 727 1339
9 3428 612
0 2663 1947
1 230 2695
2 2025 2794
3 3039 283
4 862 2889

TABLE 5-continued

Address of Parity Bit Accumulators (Shortened from Rate 4/5)

5 376 2110
6 2034 2286
7 951 2068
8 3108 3542
9 307 1421
0 2272 1197
1 1800 3280
2 331 2308
3 465 2552
4 1038 2479
5 1383 343
6 94 236
7 2619 121
8 1497 2774
9 2116 1855
0 722 1584
1 2767 1881
2 2701 1610
3 3283 1732
4 168 1099
5 3074 243
6 3460 945
7 2049 1746
8 566 1427
9 3545 1168

TABLE 6

Address of Parity Bit Accumulators (Shortened from Rate 5/6)

3 2409 499 1481 908 559 716 1270 333 2508 2264 1702 2805
4 2447 1926
5 414 1224
6 2114 842
7 212 573
0 2383 2112
1 2286 2348
2 545 819
3 1264 143
4 1701 2258
5 964 166
6 114 2413
7 2243 81
0 1245 1581
1 775 169
2 1696 1104
3 1914 2831
4 532 1450
5 91 974
6 497 2228
7 2326 1579
0 2482 256
1 1117 1261
2 1257 1658
3 1478 1225
4 2511 980
5 2320 2675
6 435 1278
7 228 503
0 1885 2369
1 57 483
2 838 1050
3 1231 1990
4 1738 68
5 2392 951
6 163 645
7 2644 1704

TABLE 7

Address of Parity Bit Accumulators (Rate 8/9)

0 1558 712 805
1 1450 873 1337
2 1741 1129 1184
3 294 806 1566
4 482 605 923
0 926 1578
1 777 1374
2 608 151
3 1195 210
4 1484 692
0 427 488
1 828 1124
2 874 1366
3 1500 835
4 1496 502
0 1006 1701
1 1155 97
2 657 1403
3 1453 624
4 429 1495
0 809 385
1 367 151
2 1323 202
3 960 318
4 1451 1039
0 1098 1722
1 1015 1428
2 1261 1564
3 544 1190
4 1472 1246
0 508 630
1 421 1704
2 284 898
3 392 577
4 1155 556
0 631 1000
1 732 1368
2 1328 329
3 1515 506
4 1104 1172

TABLE 8

Address of Parity Bit Accumulators (Rate 1/3)

416 8909 4156 3216 3112 2560 2912 6405 8593 4969 6723 6912
8978 3011 4339 9312 6396 2957 7288 5485 6031 10218 2226 3575
3383 10059 1114 10008 10147 9384 4290 434 5139 3536 1965 2291
2797 3693 7615 7077 743 1941 8716 6215 3840 5140 4582 5420
6110 8551 1515 7404 4879 4946 5383 1831 3441 9569 10472 4306
1505 5682 7778
7172 6830 6623
7281 3941 3505
10270 8669 914
3622 7563 9388
9930 5058 4554
4844 9609 2707
6883 3237 1714
4768 3878 10017
10127 3334 8267

TABLE 9

Address of Parity Bit Accumulators (Shortened from Rate 1/5)

6295 9626 304 7695 4839 4936 1660 144 11203 5567 6347 12557
10691 4988 3859 3734 3071 3494 7687 10313 5964 8069 8296 11090
10774 3613 5208 11177 7676 3549 8746 6583 7239 12265 2674 4292
11869 3708 5981 8718 4908 10650 6805 3334 2627 10461 9285 11120
7844 3079 10773
3385 10854 5747
1360 12010 12202

TABLE 9-continued

Address of Parity Bit Accumulators (Shortened from Rate 1/5)

6189 4241 2343
9840 12726 4977

TABLE 10

Address of Parity Bit Accumulators (Rate 2/5)

5650 4143 8750 583 6720 8071 635 1767 1344 6922 738 6658
5696 1685 3207 415 7019 5023 5608 2605 857 6915 1770 8016
3992 771 2190 7258 8970 7792 1802 1866 6137 8841 886 1931
4108 3781 7577 6810 9322 8226 5396 5867 4428 8827 7766 2254
4247 888 4367 8821 9660 324 5864 4774 227 7889 6405 8963
9693 500 2520 2227 1811 9330 1928 5140 4030 4824 806 3134
1652 8171 1435
3366 6543 3745
9286 8509 4645
7397 5790 8972
6597 4422 1799
9276 4041 3847
8683 7378 4946
5348 1993 9186
6724 9015 5646
4502 4439 8474
5107 7342 9442
1387 8910 2660.

16. A system according to claim 15, wherein the BCH outer code is applied to the LDPC code based on a generator polynomial of:

$$g(x)=(1+x+x^3+x^5+x^{14})\times(1+x^6+x^8+x^{11}+x^{14})\times(1+x+x^2+x^6+x^9+x^{10}+x^{14})\times(1+x^4+x^7+x^8+x^{10}+x^{12}+x^{14})\times(1+x^2+x^4+x^6+x^8+x^9+x^{11}+x^{13}+x^{14})\times(1+x^3+x^7+x^8+x^9+x^{13}+x^{14})\times(1+x^2+x^5+x^6+x^7+x^{10}+x^{11}+x^{13}+x^{14})\times(1+x^5+x^8+x^9+x^{10}+x^{11}+x^{14})\times(1+x+x^2+x^3+x^9+x^{10}+x^{14})\times(1+x^3+x^6+x^9+x^{11}+x^{12}+x^{14})\times(1+x^4+x^{11}+x^{12}+x^{14})\times(1+x+x^2+x^3+x^5+x^6+x^7+x^8+x^{10}+x^{13}+x^{14}).$$

17. A system according to claim 15, wherein $n_{ldpc}$ equals to 16200, and the Bose Chaudhuri Hocquenghem (BCH) encoder is further configured to generate the outer BCH code according to Table 11 to output a coded signal:

TABLE 11

| $k_{ldpc}$ | $k_{bch}$ | BCH Correction (bits) | Effective LDPC Rate $k_{ldpc}/n_{ldpc}$ |
|---|---|---|---|
| 7200 | 7032 | 12 | 0.444 |
| 9720 | 9552 | 12 | 3/5 |
| 10800 | 10632 | 12 | 2/3 |
| 11880 | 11712 | 12 | 0.733 |
| 12600 | 12432 | 12 | 0.777 |
| 13320 | 13152 | 12 | 0.822 |
| 14400 | 14232 | 12 | 8/9. |

18. A system according to claim 17, wherein the coded signal is utilized in a digital video application.

19. A system according to claim 18, wherein the digital video application conforms with MPEG (Motion Picture Expert Group) packet transmission.

20. A system according to claim 15, wherein the cyclic redundancy check (CRC) encoder is further configured to encode using a generator polynomial of $(x^5+x^4+x^3+x^2+1)(x^2+x+1)(x+1)$.

21. A device for encoding data, comprising:
  a cyclic redundancy check (CRC) circuit configured to encode information bits;

Bose Chaudhuri Hocquenghem (BCH) circuit configured to receive the CRC encoded bits; and a Low Density Parity Check (LDPC) circuit coupled to the BCH circuit for outputting, based on the information bits, an LDPC code having an outer BCH code by accumulating bits at parity bit addresses as specified by any one of Tables 1-10 for transmission as the LDPC coded signal, wherein parity bits, $p_i$, are determined according to $p_i = p_i \oplus p_{i-1}$, $i = 1, 2, \ldots, n_{ldpc} - k_{ldpc} - 1$, $k_{ldpc}$ being information block size and $n_{ldpc}$ being codeword size:

TABLE 1

Address of Parity Bit Accumulators (Shortened from Rate 1/2)

20 712 2386 6354 4061 1062 5045 5158
21 2543 5748 4822 2348 3089 6328 5876
22 926 5701 269 3693 2438 3190 3507
23 2802 4520 3577 5324 1091 4667 4449
24 5140 2003 1263 4742 6497 1185 6202
0 4046 6934
1 2855 66
2 6694 212
3 3439 1158
4 3850 4422
5 5924 290
6 1467 4049
7 7820 2242
8 4606 3080
9 4633 7877
10 3884 6868
11 8935 4996
12 3028 764
13 5988 1057
14 7411 3450

TABLE 2

Address of Parity Bit Accumulators (Rate 3/5)

2765 5713 6426 3596 1374 4811 2182 544 3394 2840 4310 771
4951 211 2208 723 1246 2928 398 5739 265 5601 5993 2615
210 4730 5777 3096 4282 6238 4939 1119 6463 5298 6320 4016
4167 2063 4757 3157 5664 3956 6045 563 4284 2441 3412 6334
4201 2428 4474 59 1721 736 2997 428 3807 1513 4732 6195
2670 3081 5139 3736 1999 5889 4362 3806 4534 5409 6384 5809
5516 1622 2906 3285 1257 5797 3816 817 875 2311 3543 1205
4244 2184 5415 1705 5642 4886 2333 287 1848 1121 3595 6022
2142 2830 4069 5654 1295 2951 3919 1356 884 1786 396 4738
0 2161 2653
1 1380 1461
2 2502 3707
3 3971 1057
4 5985 6062
5 1733 6028
6 3786 1936
7 4292 956
8 5692 3417
9 266 4878
10 4913 3247
11 4763 3937
12 3590 2903
13 2566 4215
14 5208 4707
15 3940 3388
16 5109 4556
17 4908 4177

TABLE 3

Address of Parity Bit Accumulators (Rate 2/3)

0 2084 1613 1548 1286 1460 3196 4297 2481 3369 3451 4620 2622
1 122 1516 3448 2880 1407 1847 3799 3529 373 971 4358 3108
2 259 3399 929 2650 864 3996 3833 107 5287 164 3125 2350
3 342 3529
4 4198 2147

TABLE 3-continued

Address of Parity Bit Accumulators (Rate 2/3)

5 1880 4836
6 3864 4910
7 243 1542
8 3011 1436
9 2167 2512
10 4606 1003
11 2835 705
12 3426 2365
13 3848 2474
14 1360 1743
0 163 2536
1 2583 1180
2 1542 509
3 4418 1005
4 5212 5117
5 2155 2922
6 347 2696
7 226 4296
8 1560 487
9 3926 1640
10 149 2928
11 2364 563
12 635 688
13 231 1684
14 1129 3894

TABLE 4

Address of Parity Bit Accumulators (Shortened from Rate 3/4)

3 3198 478 4207 1481 1009 2616 1924 3437 554 683 1801
4 2681 2135
5 3107 4027
6 2637 3373
7 3830 3449
8 4129 2060
9 4184 2742
10 3946 1070
11 2239 984
0 1458 3031
1 3003 1328
2 1137 1716
3 132 3725
4 1817 638
5 1774 3447
6 3632 1257
7 542 3694
8 1015 1945
9 1948 412
10 995 2238
11 4141 1907
0 2480 3079
1 3021 1088
2 713 1379
3 997 3903
4 2323 3361
5 1110 986
6 2532 142
7 1690 2405
8 1298 1881
9 615 174
10 1648 3112
11 1415 2808

TABLE 5

Address of Parity Bit Accumulators (Shortened from Rate 4/5)

5 896 1565
6 2493 184
7 212 3210
8 727 1339
9 3428 612

TABLE 5-continued

Address of Parity Bit Accumulators (Shortened from Rate 4/5)

0 2663 1947  
1 230 2695  
2 2025 2794  
3 3039 283  
4 862 2889  
5 376 2110  
6 2034 2286  
7 951 2068  
8 3108 3542  
9 307 1421  
0 2272 1197  
1 1800 3280  
2 331 2308  
3 465 2552  
4 1038 2479  
5 1383 343  
6 94 236  
7 2619 121  
8 1497 2774  
9 2116 1855  
0 722 1584  
1 2767 1881  
2 2701 1610  
3 3283 1732  
4 168 1099  
5 3074 243  
6 3460 945  
7 2049 1746  
8 566 1427  
9 3545 1168

TABLE 6

Address of Parity Bit Accumulators (Shortened from Rate 5/6)

3 2409 499 1481 908 559 716 1270 333 2508 2264 1702 2805  
4 2447 1926  
5 414 1224  
6 2114 842  
7 212 573  
0 2383 2112  
1 2286 2348  
2 545 819  
3 1264 143  
4 1701 2258  
5 964 166  
6 114 2413  
7 2243 81  
0 1245 1581  
1 775 169  
2 1696 1104  
3 1914 2831  
4 532 1450  
5 91 974  
6 497 2228  
7 2326 1579  
0 2482 256  
1 1117 1261  
2 1257 1658  
3 1478 1225  
4 2511 980  
5 2320 2675  
6 435 1278  
7 228 503  
0 1885 2369  
1 57 483  
2 838 1050  
3 1231 1990  
4 1738 68  
5 2392 951  
6 163 645  
7 2644 1704

TABLE 7

Address of Parity Bit Accumulators (Rate 8/9)

0 1558 712 805  
1 1450 873 1337  
2 1741 1129 1184  
3 294 806 1566  
4 482 605 923  
0 926 1578  
1 777 1374  
2 608 151  
3 1195 210  
4 1484 692  
0 427 488  
1 828 1124  
2 874 1366  
3 1500 835  
4 1496 502  
0 1006 1701  
1 1155 97  
2 657 1403  
3 1453 624  
4 429 1495  
0 809 385  
1 367 151  
2 1323 202  
3 960 318  
4 1451 1039  
0 1098 1722  
1 1015 1428  
2 1261 1564  
3 544 1190  
4 1472 1246  
0 508 630  
1 421 1704  
2 284 898  
3 392 577  
4 1155 556  
0 631 1000  
1 732 1368  
2 1328 329  
3 1515 506  
4 1104 1172

TABLE 8

Address of Parity Bit Accumulators (Rate 1/3)

416 8909 4156 3216 3112 2560 2912 6405 8593 4969 6723 6912  
8978 3011 4339 9312 6396 2957 7288 5485 6031 10218 2226 3575  
3383 10059 1114 10008 10147 9384 4290 434 5139 3536 1965 2291  
2797 3693 7615 7077 743 1941 8716 6215 3840 5140 4582 5420  
6110 8551 1515 7404 4879 4946 5383 1831 3441 9569 10472 4306  
1505 5682 7778  
7172 6830 6623  
7281 3941 3505  
10270 8669 914  
3622 7563 9388  
9930 5058 4554  
4844 9609 2707  
6883 3237 1714  
4768 3878 10017  
10127 3334 8267

TABLE 9

Address of Parity Bit Accumulators (Shortened from Rate 1/5)

6295 9626 304 7695 4839 4936 1660 144 11203 5567 6347 12557  
10691 4988 3859 3734 3071 3494 7687 10313 5964 8069 8296 11090  
10774 3613 5208 11177 7676 3549 8746 6583 7239 12265 2674 4292  
11869 3708 5981 8718 4908 10650 6805 3334 2627 10461 9285 11120  
7844 3079 10773  
3385 10854 5747  
1360 12010 12202

TABLE 9-continued

Address of Parity Bit Accumulators (Shortened from Rate 1/5)

6189 4241 2343
9840 12726 4977

TABLE 10

Address of Parity Bit Accumulators (Rate 2/5)

5650 4143 8750 583 6720 8071 635 1767 1344 6922 738 6658
5696 1685 3207 415 7019 5023 5608 2605 857 6915 1770 8016
3992 771 2190 7258 8970 7792 1802 1866 6137 8841 886 1931
4108 3781 7577 6810 9322 8226 5396 5867 4428 8827 7766 2254
4247 888 4367 8821 9660 324 5864 4774 227 7889 6405 8963
9693 500 2520 2227 1811 9330 1928 5140 4030 4824 806 3134
1652 8171 1435
3366 6543 3745
9286 8509 4645
7397 5790 8972
6597 4422 1799
9276 4041 3847
8683 7378 4946
5348 1993 9186
6724 9015 5646
4502 4439 8474
5107 7342 9442
1387 8910 2660.

22. A method for encoding data, comprising:
decoding an encoded signal,
wherein the encoded signal is coded according to a Low Density Parity Check (LDPC) code by accumulating bits at parity bit addresses as specified by any one of Tables 1-10 for transmission as an LDPC coded signal, wherein parity bits, $p_i$, are determined according to $p_i = p_i \oplus p_{i-1}$, $i=1,2,\ldots,n_{ldpc}-k_{ldpc}-1$, $k_{ldpc}$ being information block size and $n_{ldpc}$ being codeword size:

TABLE 1

Address of Parity Bit Accumulators (Shortened from Rate 1/2)

20 712 2386 6354 4061 1062 5045 5158
21 2543 5748 4822 2348 3089 6328 5876
22 926 5701 269 3693 2438 3190 3507
23 2802 4520 3577 5324 1091 4667 4449
24 5140 2003 1263 4742 6497 1185 6202
0 4046 6934
1 2855 66
2 6694 212
3 3439 1158
4 3850 4422
5 5924 290
6 1467 4049
7 7820 2242
8 4606 3080
9 4633 7877
10 3884 6868
11 8935 4996
12 3028 764
13 5988 1057
14 7411 3450

TABLE 2

Address of Parity Bit Accumulators (Rate 3/5)

2765 5713 6426 3596 1374 4811 2182 544 3394 2840 4310 771
4951 211 2208 723 1246 2928 398 5739 265 5601 5993 2615
210 4730 5777 3096 4282 6238 4939 1119 6463 5298 6320 4016
4167 2063 4757 3157 5664 3956 6045 563 4284 2441 3412 6334

TABLE 2-continued

Address of Parity Bit Accumulators (Rate 3/5)

4201 2428 4474 59 1721 736 2997 428 3807 1513 4732 6195
2670 3081 5139 3736 1999 5889 4362 3806 4534 5409 6384 5809
5516 1622 2906 3285 1257 5797 3816 817 875 2311 3543 1205
4244 2184 5415 1705 5642 4886 2333 287 1848 1121 3595 6022
2142 2830 4069 5654 1295 2951 3919 1356 884 1786 396 4738
0 2161 2653
1 1380 1461
2 2502 3707
3 3971 1057
4 5985 6062
5 1733 6028
6 3786 1936
7 4292 956
8 5692 3417
9 266 4878
10 4913 3247
11 4763 3937
12 3590 2903
13 2566 4215
14 5208 4707
15 3940 3388
16 5109 4556
17 4908 4177

TABLE 3

Address of Parity Bit Accumulators (Rate 2/3)

0 2084 1613 1548 1286 1460 3196 4297 2481 3369 3451 4620 2622
1 122 1516 3448 2880 1407 1847 3799 3529 373 971 4358 3108
2 259 3399 929 2650 864 3996 3833 107 5287 164 3125 2350
3 342 3529
4 4198 2147
5 1880 4836
6 3864 4910
7 243 1542
8 3011 1436
9 2167 2512
10 4606 1003
11 2835 705
12 3426 2365
13 3848 2474
14 1360 1743
0 163 2536
1 2583 1180
2 1542 509
3 4418 1005
4 5212 5117
5 2155 2922
6 347 2696
7 226 4296
8 1560 487
9 3926 1640
10 149 2928
11 2364 563
12 635 688
13 231 1684
14 1129 3894

TABLE 4

Address of Parity Bit Accumulators (Shortened from Rate 3/4)

3 3198 478 4207 1481 1009 2616 1924 3437 554 683 1801
4 2681 2135
5 3107 4027
6 2637 3373
7 3830 3449
8 4129 2060
9 4184 2742
10 3946 1070
11 2239 984

TABLE 4-continued

Address of Parity Bit Accumulators (Shortened from Rate 3/4)

0 1458 3031
1 3003 1328
2 1137 1716
3 132 3725
4 1817 638
5 1774 3447
6 3632 1257
7 542 3694
8 1015 1945
9 1948 412
10 995 2238
11 4141 1907
0 2480 3079
1 3021 1088
2 713 1379
3 997 3903
4 2323 3361
5 1110 986
6 2532 142
7 1690 2405
8 1298 1881
9 615 174
10 1648 3112
11 1415 2808

TABLE 5

Address of Parity Bit Accumulators (Shortened from Rate 4/5)

5 896 1565
6 2493 184
7 212 3210
8 727 1339
9 3428 612
0 2663 1947
1 230 2695
2 2025 2794
3 3039 283
4 862 2889
5 376 2110
6 2034 2286
7 951 2068
8 3108 3542
9 307 1421
0 2272 1197
1 1800 3280
2 331 2308
3 465 2552
4 1038 2479
5 1383 343
6 94 236
7 2619 121
8 1497 2774
9 2116 1855
0 722 1584
1 2767 1881
2 2701 1610
3 3283 1732
4 168 1099
5 3074 243
6 3460 945
7 2049 1746
8 566 1427
9 3545 1168

TABLE 6

Address of Parity Bit Accumulators (Shortened from Rate 5/6)

3 2409 499 1481 908 559 716 1270 333 2508 2264 1702 2805
4 2447 1926
5 414 1224

TABLE 6-continued

Address of Parity Bit Accumulators (Shortened from Rate 5/6)

6 2114 842
7 212 573
0 2383 2112
1 2286 2348
2 545 819
3 1264 143
4 1701 2258
5 964 166
6 114 2413
7 2243 81
0 1245 1581
1 775 169
2 1696 1104
3 1914 2831
4 532 1450
5 91 974
6 497 2228
7 2326 1579
0 2482 256
1 1117 1261
2 1257 1658
3 1478 1225
4 2511 980
5 2320 2675
6 435 1278
7 228 503
0 1885 2369
1 57 483
2 838 1050
3 1231 1990
4 1738 68
5 2392 951
6 163 645
7 2644 1704

TABLE 7

Address of Parity Bit Accumulators (Rate 8/9)

0 1558 712 805
1 1450 873 1337
2 1741 1129 1184
3 294 806 1566
4 482 605 923
0 926 1578
1 777 1374
2 608 151
3 1195 210
4 1484 692
0 427 488
1 828 1124
2 874 1366
3 1500 835
4 1496 502
0 1006 1701
1 1155 97
2 657 1403
3 1453 624
4 429 1495
0 809 385
1 367 151
2 1323 202
3 960 318
4 1451 1039
0 1098 1722
1 1015 1428
2 1261 1564
3 544 1190
4 1472 1246
0 508 630
1 421 1704
2 284 898
3 392 577
4 1155 556

TABLE 7-continued

Address of Parity Bit Accumulators (Rate 8/9)

```
0 631 1000
1 732 1368
2 1328 329
3 1515 506
4 1104 1172
```

TABLE 8

Address of Parity Bit Accumulators (Rate 1/3)

```
416 8909 4156 3216 3112 2560 2912 6405 8593 4969 6723 6912
8978 3011 4339 9312 6396 2957 7288 5485 6031 10218 2226 3575
3383 10059 1114 10008 10147 9384 4290 434 5139 3536 1965 2291
2797 3693 7615 7077 743 1941 8716 6215 3840 5140 4582 5420
6110 8551 1515 7404 4879 4946 5383 1831 3441 9569 10472 4306
1505 5682 7778
7172 6830 6623
7281 3941 3505
10270 8669 914
3622 7563 9388
9930 5058 4554
4844 9609 2707
6883 3237 1714
4768 3878 10017
10127 3334 8267
```

TABLE 9

Address of Parity Bit Accumulators (Shortened from Rate 1/5)

```
6295 9626 304 7695 4839 4936 1660 144 11203 5567 6347 12557
10691 4988 3859 3734 3071 3494 7687 10313 5964 8069 8296 11090
10774 3613 5208 11177 7676 3549 8746 6583 7239 12265 2674 4292
11869 3708 5981 8718 4908 10650 6805 3334 2627 10461 9285 11120
7844 3079 10773
3385 10854 5747
1360 12010 12202
6189 4241 2343
9840 12726 4977
```

TABLE 10

Address of Parity Bit Accumulators (Rate 2/5)

```
5650 4143 8750 583 6720 8071 635 1767 1344 6922 738 6658
5696 1685 3207 415 7019 5023 5608 2605 857 6915 1770 8016
3992 771 2190 7258 8970 7792 1802 1866 6137 8841 886 1931
4108 3781 7577 6810 9322 8226 5396 5867 4428 8827 7766 2254
4247 888 4367 8821 9660 324 5864 4774 227 7889 6405 8963
9693 500 2520 2227 1811 9330 1928 5140 4030 4824 806 3134
1652 8171 1435
3366 6543 3745
9286 8509 4645
7397 5790 8972
6597 4422 1799
9276 4041 3847
8683 7378 4946
5348 1993 9186
6724 9015 5646
4502 4439 8474
5107 7342 9442
1387 8910 2660.
```

23. A method according to claim 22, wherein the encoded signal includes a Bose Chaudhuri Hocquenghem (BCH) outer code that is based on a generator polynomial of:

$$g(x)=(1+x+x^3+x^5+x^{14})\times(1+x^6+x^8+x^{11}+x^{14})\times(1+x+x^2+x^6+x^9+x^{10}+x^{14})\times(1+x^4+x^7+x^8+x^{10}+x^{12}+x^{14})\times(1+x^2+x^4+x^6+x^8+x^9+x^{11}+x^{13}+x^{14})\times(1+x^3+x^7+x^8+x^9+x^{13}+x^{14})\times(1+x^2+x^5+x^6+x^7+x^{10}+x^{11}+x^{13}+x^{14})\times(1+x^5+x^8+x^9+x^{10}+x^{11}+x^{14})\times(1+x+x^2+x^3+x^9+x^{10}+x^{14})\times(1+x^3+x^6+x^9+x^{11}+x^{12}+x^{14})\times(1+x^4+x^{11}+x^{12}+x^{14})\times(1+x+x^2+x^3+x^5+x^6+x^7+x^8+x^{10}+x^{13}+x^{14}).$$

24. A decoder apparatus comprising:

circuitry configured to decode an encoded signal, wherein the encoded signal is coded according to a Low Density Parity Check (LDPC) code by accumulating bits at parity bit addresses as specified by any one of Tables 1-10 for transmission as an LDPC coded signal, wherein parity bits, $p_i$, are determined according to $p_i = p_i \oplus p_{i-1}$, $i=1,2,\ldots,n_{ldpc}=k_{ldpc}-1$, $k_{ldpc}$ being information block size and $n_{ldpc}$ being codeword size:

TABLE 1

Address of Parity Bit Accumulators (Shortened from Rate 1/2)

```
20 712 2386 6354 4061 1062 5045 5158
21 2543 5748 4822 2348 3089 6328 5876
22 926 5701 269 3693 2438 3190 3507
23 2802 4520 3577 5324 1091 4667 4449
24 5140 2003 1263 4742 6497 1185 6202
0 4046 6934
1 2855 66
2 6694 212
3 3439 1158
4 3850 4422
5 5924 290
6 1467 4049
7 7820 2242
8 4606 3080
9 4633 7877
10 3884 6868
11 8935 4996
12 3028 764
13 5988 1057
14 7411 3450
```

TABLE 2

Address of Parity Bit Accumulators (Rate 3/5)

```
2765 5713 6426 3596 1374 4811 2182 544 3394 2840 4310 771
4951 211 2208 723 1246 2928 398 5739 265 5601 5993 2615
210 4730 5777 3096 4282 6238 4939 1119 6463 5298 6320 4016
4167 2063 4757 3157 5664 3956 6045 563 4284 2441 3412 6334
4201 2428 4474 59 1721 736 2997 428 3807 1513 4732 6195
2670 3081 5139 3736 1999 5889 4362 3806 4534 5409 6384 5809
5516 1622 2906 3285 1257 5797 3816 817 875 2311 3543 1205
4244 2184 5415 1705 5642 4886 2333 287 1848 1121 3595 6022
2142 2830 4069 5654 1295 2951 3919 1356 884 1786 396 4738
0 2161 2653
1 1380 1461
2 2502 3707
3 3971 1057
4 5985 6062
5 1733 6028
6 3786 1936
7 4292 956
8 5692 3417
9 266 4878
10 4913 3247
11 4763 3937
12 3590 2903
13 2566 4215
14 5208 4707
15 3940 3388
16 5109 4556
17 4908 4177
```

TABLE 3

Address of Parity Bit Accumulators (Rate 2/3)

0 2084 1613 1548 1286 1460 3196 4297 2481 3369 3451 4620 2622
1 122 1516 3448 2880 1407 1847 3799 3529 373 971 4358 3108
2 259 3399 929 2650 864 3996 3833 107 5287 164 3125 2350
3 342 3529
4 4198 2147
5 1880 4836
6 3864 4910
7 243 1542
8 3011 1436
9 2167 2512
10 4606 1003
11 2835 705
12 3426 2365
13 3848 2474
14 1360 1743
0 163 2536
1 2583 1180
2 1542 509
3 4418 1005
4 5212 5117
5 2155 2922
6 347 2696
7 226 4296
8 1560 487
9 3926 1640
10 149 2928
11 2364 563
12 635 688
13 231 1684
14 1129 3894

TABLE 4

Address of Parity Bit Accumulators (Shortened from Rate 3/4)

3 3198 478 4207 1481 1009 2616 1924 3437 554 683 1801
4 2681 2135
5 3107 4027
6 2637 3373
7 3830 3449
8 4129 2060
9 4184 2742
10 3946 1070
11 2239 984
0 1458 3031
1 3003 1328
2 1137 1716
3 132 3725
4 1817 638
5 1774 3447
6 3632 1257
7 542 3694
8 1015 1945
9 1948 412
10 995 2238
11 4141 1907
0 2480 3079
1 3021 1088
2 713 1379
3 997 3903
4 2323 3361
5 1110 986
6 2532 142
7 1690 2405
8 1298 1881
9 615 174
10 1648 3112
11 1415 2808

TABLE 5

Address of Parity Bit Accumulators (Shortened from Rate 4/5)

5 896 1565
6 2493 184
7 212 3210
8 727 1339
9 3428 612
0 2663 1947
1 230 2695
2 2025 2794
3 3039 283
4 862 2889
5 376 2110
6 2034 2286
7 951 2068
8 3108 3542
9 307 1421
0 2272 1197
1 1800 3280
2 331 2308
3 465 2552
4 1038 2479
5 1383 343
6 94 236
7 2619 121
8 1497 2774
9 2116 1855
0 722 1584
1 2767 1881
2 2701 1610
3 3283 1732
4 168 1099
5 3074 243
6 3460 945
7 2049 1746
8 566 1427
9 3545 1168

TABLE 6

Address of Parity Bit Accumulators (Shortened from Rate 5/6)

3 2409 499 1481 908 559 716 1270 333 2508 2264 1702 2805
4 2447 1926
5 414 1224
6 2114 842
7 212 573
0 2383 2112
1 2286 2348
2 545 819
3 1264 143
4 1701 2258
5 964 166
6 114 2413
7 2243 81
0 1245 1581
1 775 169
2 1696 1104
3 1914 2831
4 532 1450
5 91 974
6 497 2228
7 2326 1579
0 2482 256
1 1117 1261
2 1257 1658
3 1478 1225
4 2511 980
5 2320 2675
6 435 1278
7 228 503
0 1885 2369
1 57 483
2 838 1050
3 1231 1990
4 1738 68

TABLE 6-continued

Address of Parity Bit Accumulators (Shortened from Rate 5/6)

5 2392 951
6 163 645
7 2644 1704

TABLE 7

Address of Parity Bit Accumulators (Rate 8/9)

0 1558 712 805
1 1450 873 1337
2 1741 1129 1184
3 294 806 1566
4 482 605 923
0 926 1578
1 777 1374
2 608 151
3 1195 210
4 1484 692
0 427 488
1 828 1124
2 874 1366
3 1500 835
4 1496 502
0 1006 1701
1 1155 97
2 657 1403
3 1453 624
4 429 1495
0 809 385
1 367 151
2 1323 202
3 960 318
4 1451 1039
0 1098 1722
1 1015 1428
2 1261 1564
3 544 1190
4 1472 1246
0 508 630
1 421 1704
2 284 898
3 392 577
4 1155 556
0 631 1000
1 732 1368
2 1328 329
3 1515 506
4 1104 1172

TABLE 8

Address of Parity Bit Accumulators (Rate 1/3)

416 8909 4156 3216 3112 2560 2912 6405 8593 4969 6723 6912
8978 3011 4339 9312 6396 2957 7288 5485 6031 10218 2226 3575
3383 10059 1114 10008 10147 9384 4290 434 5139 3536 1965 2291
2797 3693 7615 7077 743 1941 8716 6215 3840 5140 4582 5420
6110 8551 1515 7404 4879 4946 5383 1831 3441 9569 10472 4306
1505 5682 7778
7172 6830 6623
7281 3941 3505
10270 8669 914
3622 7563 9388

TABLE 8-continued

Address of Parity Bit Accumulators (Rate 1/3)

9930 5058 4554
4844 9609 2707
6883 3237 1714
4768 3878 10017
10127 3334 8267

TABLE 9

Address of Parity Bit Accumulators (Shortened from Rate 1/5)

6295 9626 304 7695 4839 4936 1660 144 11203 5567 6347 12557
10691 4988 3859 3734 3071 3494 7687 10313 5964 8069 8296 11090
10774 3613 5208 11177 7676 3549 8746 6583 7239 12265 2674 4292
11869 3708 5981 8718 4908 10650 6805 3334 2627 10461 9285 11120
7844 3079 10773
3385 10854 5747
1360 12010 12202
6189 4241 2343
9840 12726 4977

TABLE 10

Address of Parity Bit Accumulators (Rate 2/5)

5650 4143 8750 583 6720 8071 635 1767 1344 6922 738 6658
5696 1685 3207 415 7019 5023 5608 2605 857 6915 1770 8016
3992 771 2190 7258 8970 7792 1802 1866 6137 8841 886 1931
4108 3781 7577 6810 9322 8226 5396 5867 4428 8827 7766 2254
4247 888 4367 8821 9660 324 5864 4774 227 7889 6405 8963
9693 500 2520 2227 1811 9330 1928 5140 4030 4824 806 3134
1652 8171 1435
3366 6543 3745
9286 8509 4645
7397 5790 8972
6597 4422 1799
9276 4041 3847
8683 7378 4946
5348 1993 9186
6724 9015 5646
4502 4439 8474
5107 7342 9442
1387 8910 2660.

25. An apparatus according to claim 24, wherein the encoded signal includes a Bose Chaudhuri Hocquenghem (BCH) outer code that is based on a generator polynomial of:

$g(x) = (1+x+x^3+x^5+x^{14}) \times (1+x^6+x^8+x^{11}+x^{14}) \times (1+x+x^2+x^6+x^9+x^{10}+x^{14}) \times$ $(1+x^4+x^7+x^8+x^{10}+x^{12}+x^{14}) \times (1+x^2+x^4+x^6+x^8+x^9+x^{11}+x^{13}+x^{14}) \times$ $(1+x^3+x^7+x^8+x^9+x^{13}+x^{14}) \times (1+x^2+x^5+x^6+x^7+x^{10}+x^{11}+x^{13}+x^{14}) \times$ $(1+x^5+x^8+x^9+x^{10}+x^{11}+x^{14}) \times (1+x+x^2+x^3+x^9+x^{10}+x^{14}) \times (1+x^3+x^6+x^9+x^{11}+x^{12}+x^{14}) \times$ $(1+x^4+x^{11}+x^{12}+x^{14}) \times (1+x+x^2+x^3+x^5+x^6+x^7+x^8+x^{10}+x^{13}+x^{14})$.

* * * * *